United States Patent
Cao

(10) Patent No.: US 7,465,352 B2
(45) Date of Patent: Dec. 16, 2008

(54) ONE-POT SYNTHESIS OF HIGH-QUALITY METAL CHALCOGENIDE NANOCRYSTALS WITHOUT PRECURSOR INJECTION

(75) Inventor: Yunwei Charles Cao, Gainesville, FL (US)

(73) Assignee: University of Florida Research Foundation, Inc., Gainesville, FL (US)

( * ) Notice: Subject to any disclaimer, the term of this patent is extended or adjusted under 35 U.S.C. 154(b) by 346 days.

(21) Appl. No.: 11/188,352

(22) Filed: Jul. 25, 2005

(65) Prior Publication Data
US 2006/0019427 A1 Jan. 26, 2006

Related U.S. Application Data

(60) Provisional application No. 60/590,876, filed on Jul. 23, 2004.

(51) Int. Cl.
*C30B 7/14* (2006.01)
(52) U.S. Cl. ............ 117/68; 117/70; 117/956; 117/957
(58) Field of Classification Search ............ 117/68, 117/70, 956, 957
See application file for complete search history.

(56) References Cited

U.S. PATENT DOCUMENTS 7,144,458 B2 * 12/2006 Zehnder et al. ............ 117/68
2005/0022726 A1 * 2/2005 Wong et al. ............... 117/105

* cited by examiner

*Primary Examiner*—Robert M Kunemund
(74) *Attorney, Agent, or Firm*—Saliwanchik, Lloyd & Saliwanchik

(57) ABSTRACT

A method of homogeneously forming metal chalcogenide nanocrystals includes the steps combining a metal source, a chalcogenide source, and at least one solvent at a first temperature to form a liquid comprising assembly, and heating the assembly at a sufficient temperature to initiate nucleation to form a plurality of metal chalcogenide nanocrystals. The plurality of metal chalcogenide nanocrystals are then grown without injection of either the metal source or the chalcogenide source at a temperature at least equal to the sufficient temperature, wherein growth proceeds substantially without nucleation to form a plurality of monodisperse metal chalcogenide nanocrystals. An optional nucleation initiator can help control the final size of the monodisperse crystals. Such synthesis, without the need for precursor injection, is suitable for the industrial preparation of high-quality nanocrystals.

20 Claims, 21 Drawing Sheets tetra-ethylthiuram disulfides, dithiocarbamate derivatives
$n_0=1,2,3...; R=CH_3, C_2H_5,...$ 2,2'-dithiobisbenzothiazole, 2-(morpholinothio) benzothiazole, N-butylbenzothiazole-2-sulfenamide, and 2-mercaptobenzothiazole

BHT

BHT derivatives
$R = C_2H_5, C_3H_7,......$ benzeneselenol, diphenyldiselenide diphenyldiselenide tetra-ethylthiuram disulfides, dithiocarbamate derivatives $n_0=1,2,3...; R=CH_3, C_2H_5,.....$ 2,2'-dithiobisbenzothiazole,   2-(morpholinothio) benzothiazole,   N-butylbenzothiazole-2-sulfenamide, and 2-mercaptobenzothiazole BHT    BHT derivatives    $R = C_2H_5, C_3H_7,.......$ benzeneselenol, diphenyldiselenide diphenyldiselenide (a)

(b)            (c)

ONE-POT SYNTHESIS OF HIGH-QUALITY METAL CHALCOGENIDE NANOCRYSTALS WITHOUT PRECURSOR INJECTION

CROSS-REFERENCE TO RELATED APPLICATIONS

The present application incorporates by reference in its entirety and claims the benefit of U.S. Provisional Application No. 60/590,876 filed on Jul. 23, 2004.

STATEMENT REGARDING FEDERALLY SPONSORED RESEARCH OR DEVELOPMENT

Not applicable.

BACKGROUND OF THE INVENTION

The formation of high-quality semiconductor nanocrystals, with well-controlled size and shape as well as well-confined surface passivation, can be achieved by controlling the thermodynamics and kinetics during the nucleation and growth of nanocrystals. However, the separation of the nucleation and growth stages is a prerequisite for producing high-quality nanocrystals which generally require uniform shape and a tight size distribution. When nucleation occurs concurrently with the growth of nanocrystals, a broad nanocrystal size distribution generally results.

In colloidal synthesis, methods are known which separate the nucleation stage from the nanocrystal growth stage. The key part of this synthetic method is the injection of room-temperature organometallic precursors into well-stirred, hot organic solvents. Nucleation takes place immediately after the injection and continues until the temperature and the precursor concentration both drop below critical threshold levels. In this case, the nucleation time is determined by the rate of the precursor injection and the mass transfer in the reaction system. Therefore, rapid precursor injection and strong stirring leads to a short nucleation time, and thus achieves a separation between nucleation and growth stages. This method has led to synthesis of a variety of high-quality nanocrystals ranging from II-VI (e.g., CdS and CdSe) and III-V (e.g., InP and InAs) to IV-VI (e.g., PbS and PbSe) semiconductors, which are of great importance to applications including biological labeling, LEDs, lasers, and solar cells.

However, the injection-based synthetic method is not suitable for large-scale, industrial preparation (e.g., hundreds of kilograms), even though it can be scaled up to the order of grams. Industrial preparation of nanocrystals requires batch reactors that can be tens of thousands of times larger than those in research laboratories. In this industrial case, the rapid injection of precursors needed to separate nucleation and growth is very difficult to achieve. Moreover, the limitations of mass transfer in the industrial reactors further diminish the merits of the injection method. Therefore, the injection-based synthetic method cannot produce high-quality nanocrystals on an industrial scale. To overcome this difficulty, new synthetic methods that do not require the injection of precursors are needed.

The formation of high-quality nanocrystals is often favored at high temperatures (e.g., >200° C.). This creates a major challenge for making monodispersed nanocrystals through a non-injection-based synthesis, because such a synthesis involves a period of increasing temperature over a broad range, such as from room temperature to over 200° C. This broad temperature range often leads to concurrent nucleation and growth of nanocrystals in the syntheses, and results in products with poor monodispersity. Thus, although some reports have detailed one-pot synthesis of semiconductor nanocrystals without precursor injection, the quality (in terms of shape and size distribution) of the nanocrystal product is not comparable to that of the nanocrystals made by the precursor injection method. For example, nanocrystals made without precursor injection exhibit optical properties that are inferior to those produced by the injection method, such as providing fewer exciton absorption peaks, which are critical for nanocrystal applications in advanced optical and electronic devices.

SUMMARY OF THE INVENTION

A method of forming metal chalcogenide nanocrystals without precursor injection comprises the steps of combining a metal source, a chalcogenide source, and at least one solvent at a first temperature to form a liquid comprising assembly. The assembly is heated to a sufficient temperature to initiate nucleation to form a plurality of metal chalcogenide nanocrystals. A growing step then follows where the plurality of metal chalcogenide nanocrystals are grown without injection of either the metal source or the chalcogenide source at a temperature at least equal to the sufficient temperature, wherein growth during the growing step proceeds substantially without nucleation to form a plurality of monodisperse metal chalcogenide nanocrystals.

The inventive method is suitable for the large scale industrial preparation of high-quality monodisperse metal chalcogenide nanocrystals. As defined herein, the phrase "monodisperse distribution" refers to a distribution of nanoparticles where the standard deviation in the distribution is less than 20% of the mean particle size in the distribution, and preferably less than 10% of the mean size, such as 3% to 10%.

The chalcogenide source can be a chalcogenide powder which is insoluble in the solvent at the first temperature, such as chalcogenide powder. In this embodiment, the metal source can comprises cadmium myristate, and the metal chalcogenide nanocrystals comprise CdSe.

In another embodiment, the metal source can be cadmium myristate and the chalcogenide source S powder, the metal chalcogenide nanocrystals being CdS nanocrystals. In another embodiment, the metal precursor source is zinc myristate and the chalcogenide source is Se powder, the metal chalcogenide nanocrystals being ZnSe nanocrystals. In yet another embodiment, the chalcogenide precursor can be tributylphosphine telluride (TBPTe), the metal precursor cadmium octadecylphosphonate, to form CdTe nanocrystals.

The solvent can be octadecene. The metal chalcogenide nanocrystals can include two or more different metals and/or two or different chalcogenides. The metal chalcogenide nanocrystals can be selected from the group consisting of ZnS, HgS, HgSe, HgTe, $Cd_{1-n}Hg_nSe$, $Cd_{1-n}Hg_nTe$, $Cd_{1-n}Hg_nS$, $Cd_{1-n}Hg_nSe_{1-m}S_m$, $Cd_{1-n}Zn_nS$, $Cd_{1-n}Zn_nSe$, $Cd_{1-n}Zn_nTe$, $Cd_{1-n}Zn_nTe_{1-m}Se_m$ and $Cd_{1-n}Zn_nSe_{1-m}S_m$. The metal chalcogenide nanocrystals can be doped or alloy nanocrystals selected from the group consisting of $Cd_{1-n}X_n$ C (C=S, Se, Te, X=Mn, Cu, Cr, Co, Fe, Ni, transition metals, and rare earths such as Eu, Gd, or $Zn_{1-n}X_n$ C (C=S, Se, Te, X=Mn, Cu, Cr, Co, Fe, Ni, transition metals, and rare earths such as Eu, and Gd).

The metal chalcogenide nanocrystals can have the zinc blende or wurtzite crystal structure. The metal chalcogenide nanocrystals can comprise CdS having said wurtzite crystal structure or wirzite crystal structure dependant on a composition of the liquid comprising assembly. The metal chalcogenide nanocrystals can comprise CdSe having said zinc blende crystal structure.

The method can include at least one nucleation initiator. The nucleation initiator can control a number of stable nuclei initiated in the heating step. In one embodiment, the initiator can comprise a thiazole or a dithiocarbamate and the metal chalocogenide can comprise a metal sulfide. In another embodiment, the initiator can also comprises benzeneselenol, diphenyldiselenide or BHT, or derivatives thereof, and the metal chalcogenide comprise a metal selenide. In yet another embodiment, the initiator comprises benzenetellunol, diphenyldtelluride, or BHT, or derivatives thereof, and the metal chalcogenide comprises a metal telluride. In a further embodiment, the initiator comprises a tetra-ethylthiuram disulfide and a dithiobisbenzothiazole, and the metal chalcogenide comprises CdS.

BRIEF DESCRIPTION OF THE DRAWINGS

There is shown in the drawings embodiments which are presently preferred, it being understood, however, that the invention can be embodied in other forms without departing from the spirit or essential attributes thereof.

DETAILED DESCRIPTION OF THE INVENTION

Figure 1:
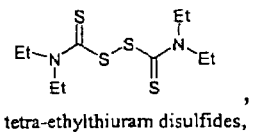
FIG. 1 shows the structure of some exemplary nucleation initiators according to the invention.
Figure 1:
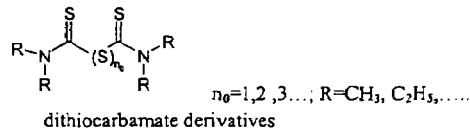
Figure 1:
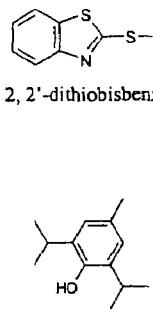
Figure 1:
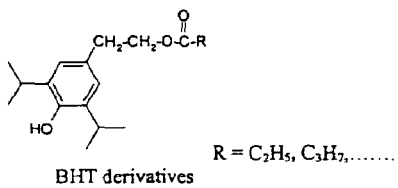
Figure 1:
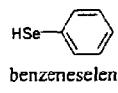
Figure 1:
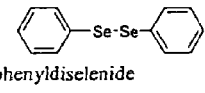
Figure 1:
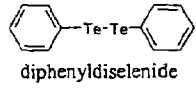

A method of forming metal chalcogenide nanocrystals without precursor injection comprises the steps of combining a metal source, a chalcogenide source, and at least one solvent at a first temperature to form a liquid comprising assembly. The assembly is heated at a sufficient temperature to initiate nucleation to form a plurality of metal chalcogenide nanocrystals. A growing step then follows where the plurality of metal chalcogenide nanocrystals are grown without injection of either the metal source or the chalcogenide source at a temperature at least equal to the sufficient temperature, where growth during the growing step proceeds substantially without nucleation as evidenced by the formation monodisperse metal chalcogenide nanocrystals.

Although not necessary to practice the claimed invention, Applicant not seeking to be bound, provides the following explanation regarding how the invention permits formation of high-quality monodisperse metal chalcogenide nanocrystals. If the reactivity of metal and chalcogenide source is too low, there are too few nuclei formed, and the subsequent nanocrystal growth is uncontrollable, resulting in a product with poor size distribution. If the reactivity of the metal and chalcogenide source is too high, there is concurrent nucleation and growth occur during the period of increasing temperature of the reaction system again leading to poor size distribution. The invention provides selection of metal and chalcogenide sources and reaction conditions to provide balanced reactivity to provide a sufficient number of nuclei to allow controllable nanocrystal growth, without the reactivity being high enough to result in concurrent nucleation and growth occur during the period of increasing temperature. Such balanced reactivity according to the invention provides synthesis of high-quality metal chalcogenide nanocrystals.

The invention is thus a new method of controlling the thermodynamics and kinetics of the nanocrystal nucleation and growth stage, and separating the growth stage from the nucleation stage. By balancing the reactivity of the metal and chalcogenide sources as described herein, a plurality of monodisperse metal chalcogenide nanocrystals having uniform shape can be formed. The shapes can be spherical, cubic, rod-like or multi-arm.

For example, the invention can be used to produce a broad range of metal chalcogenide nanocrystals including, but not limited to ZnS, ZnSe, ZnTe, CdSe, CdTe, HgS, HgSe, HgTe, PbS, PbSe, PbTe, SnS, SnSe, SnTe, CdEuS, CdMnS, as well as the metal cations including Fe, Co, Ni, Cu, Ag, in compounds such as FeX, CoX, $Cu_2X$, $Ag_2X$, where X=S, Se or Te.

In an exemplary synthesis using balanced reactivity according to the invention, selenium powder and cadmium myristate are mixed with the coordinating solvent octadecene. The solution is heated to 240° C. at a rate of 25° C./min. No clusters are formed when the temperature is below about 200° C. After the temperature reaches 210° C., small particles (i.e., nuclei) appear. As the particles grow, their size distribution continues to decrease, and a very narrow size distribution is obtained when the temperature reaches 240° C. After the particle diameter reaches about 3.0 nm, an oleic acid ODE solution is added drop-wise into the reaction solution to stabilize the growth of the nanocrystals. Afterward, the narrow size distribution of the nanocrystals can be maintained for at least 16 h while the nanocrystals continued to grow. No measurable secondary nucleation occurs during the growth stage. Thus, separation of nucleation and growth is achieved.

Chalcogenide powder, such as selenium powder is an exemplary chalcogenide precursor source for balancing the reactivity together which can be used with a metal carboxylic acid precursor source, such as a metal myristate: $C_{14}$ acid to $C_{12}$, $C_{16}$, $C_{18}$, $C_{20}$, . . . acid; oleic acid, palmitoleic acid, myritoleic acid, or metal phosphonates, such as metal phosphonic acids (octadecylphonate: $C_{18}$-acid to $C_6$, $C_{12}$, $C_{14}$, $C_{20}$-acid).

Regarding tellurium powder, the reactivity of tellurium powder is very low in the solvent ODE, leading to very few nuclei and which results in uncontrollable crystal growth. However, by using tributylphosphine telluride (TBPTe) instead of tellurium powder as the chalcogen source, with a decreased reactivity cadmium precursor, cadmium octadecylphosphonate (as compared to cadmium myristate) was found to provide monodisperse nanocrystals. No new nucleation was detected during the synthesis, and the size distribution of nanocrystals remained narrow during the whole synthesis process.

The quality of the CdSe and CdTe nanocrystals made as described above is at least comparable with that of those best nanoparticles made by the precursor injection method. The nanocrystals are highly fluorescent and no surface trap emission is found. A typical photoluminescence (PL) quantum yield of band-gap emission is about 30% to 40%. Without size sorting, nanocrystals herein exhibit up to five exciton absorption bands, indicating their very narrow size distributions. This result is consistent with that of TEM measurements taken, where typical nanocrystal samples show sizes with a standard deviation ($\sigma$) less than 5%.

At least one nucleation initiator is optionally added to the reaction mixture in addition the metal source, chalcogenide source and solvent(s). Although monodisperse nanocrystal distributions according to the invention are possible and are provided herein (See examples) without nucleation initiators, nucleation initiators can provide enhanced control of the final size of the monodisperse nanoparticle distribution.

Figure 24:
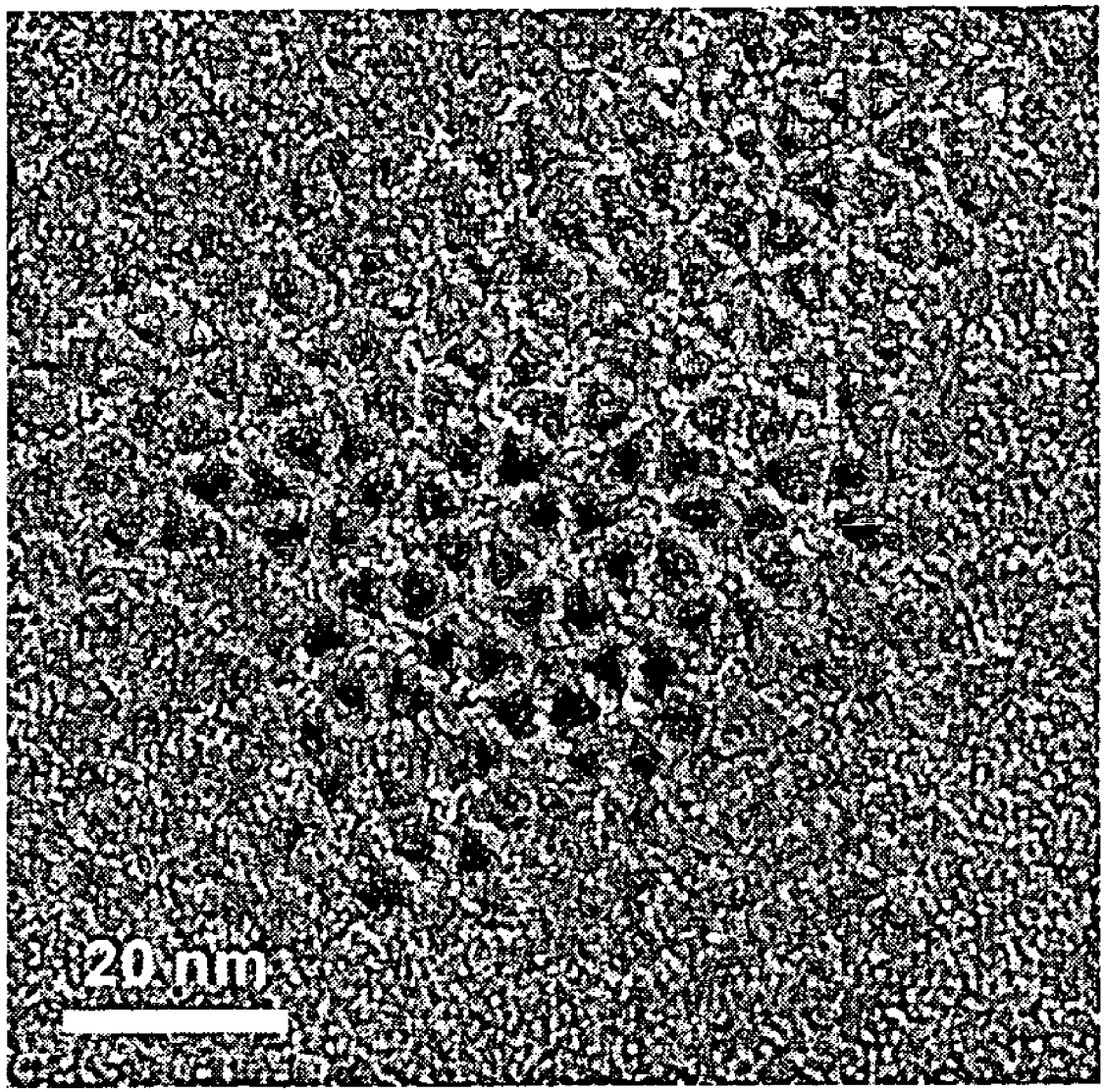
FIG. 24 is a scanned TEM image showing an ordered, triangular close-packed nanocrystal assemblies.

As used herein, a "nucleation initiator" is a compound which for a given metal source, chalcogenide source and reaction conditions (e.g. concentrations, temperature, and solvent(s)) controls the number of stable nuclei formed during the heating step where the assembly (metal source, a chalcogenide source, and solvent) is heated at a sufficient temperature to initiate nucleation of a plurality of metal chalcogenide nanocrystals. Preferred nucleation initiators control the rate of growth of the nanocrystal nuclei, and therefore the time (i.e, longer or shorter) of the nucleation stage in the growth solution. The faster the nanocrystal growth rate, the shorter the time for nucleation and therefore smaller the number of stable nuclei and vice versa. In addition, with the same amount of precursors, a smaller number of nuclei results in nanocrystals with a larger final size, and vice versa. Thus, preferred nucleation initiators control the growth rate of the nuclei during both the heating and the growing step, the number of stable nuclei formed during the heating step, as well as the final size of the nanocrystals. Even the shape of the nanoparticles can be controlled as described below in Example 18 (and accompanying FIG. 24).

Nucleation initiators include long-chain fatty amines, long-chain fatty carboxylic acids, long-chain fatty phosphonic acids, long-chain fatty sulfonic acids, and trioctylphosphine, and trioctylphosphine oxide, tributylphosphine, and tributylphosphine oxides. For example, for CdS synthesis, two exemplary nucleation initiators have been used together, tetra-ethylthiuram disulfide (hereinafter $I_1$) and 2,2'-dithiobisbenzothiazole (hereinafter $I_2$). $I_1$ and $I_2$ have been used as accelerators to increase the reactivity of sulfur in rubber vulcanization for more than 70 years, but not used before for crystal growth. The initiators will generally be different for the synthesis of different materials. Generally, initiators can include the same chalcogenide specie as the chalcogenide specie in the metal chalcogenide being produced.

FIG. 1 shows some exemplary nucleation initiators according to the invention. For metal sulfides, for example, thiazole type (e.g., tetraethylthiuram disulfides) and dithiocarbamate derivatives (e.g., 2,2'-dithiobisbenzothiazole, butylated hydroxytoluene (BHT), and derivatives of the same have been found to be efficient nucleation initiators. Benzeneselenol, diphenyldiselenide, BHT, and derivatives of the same have been found to be efficient initiators for metal selenides. For the metal tellurides, benzenetellunol, diphenyldtelluride, BHT, and derivatives of the same have been found to be efficient nucleation initiators. Some carboxylic acids can also be used as nucleation initiators, such as myristic acid.

It has also been found that certain nanocrystals made according to the invention, such as CdSe, have a different crystal phase than those made by precursor injection methods (zinc blende vs. wurtzite, respectively). These two crystal structures could produce similar X-ray powder diffraction (XRD) patterns in nanocrystals, but XRD described below in the Examples provides unambiguous evidence that the particles are of a zinc-blende structure. CdSe nanocrystals having the zinc-blende crystal phase provide an exciton band structure different from that shown in wurtzite CdSe nanocrystals. The invention thus provides the ability to tailor the optical and electronic properties of nanocrystals by controlling their crystal phases in addition to controlling their size, shape and surface passivation.

The invention has significant importance because it permits a simple way without precursor injection to make nanocrystals on an industrial scale. Uniform size and shape is of great importance for a number of applications such as biological sensing, LEDs, lasers, solar cells, and other optical and electronic devices. For example, regarding biological sensing, inorganic nanocrystal dyes (e.g. for biological labeling) formed using the invention will be attractive alternatives which may replace current organic dyes.

EXAMPLES

It should be understood that the Examples described below are provided for illustrative purposes only and do not in any way define the scope of the invention.

Examples 1-9 describe Syntheses of II-VI group nanocrystals by non-injection methods which do not include the addition of optional nucleation initiators.

Example 1

CdSe Nanocrystals Synthesis

In a standard nitrogen-protected glove box, 4.0 mg of selenium powder (0.05 mmol, 99.99%, 100 mesh) and 5.0 g 1-octadecene (ODE) were mixed in a 25 ml three-neck flask. The mixture solution was stored inside at room temperature for 24 hours. Then the flask was taken out of glove box and 56.7 mg of cadmium myristate (0.1 mmol) was further added. After that, the flask was connected to Schlenke line and the mixture solution was degassed for 10 min under vacuum (~30 mTorr) at room temperature. Under an argon flow and with stirring, the solution was heated to 240° C. at a rate of 25° C./min.

Figure 2A:
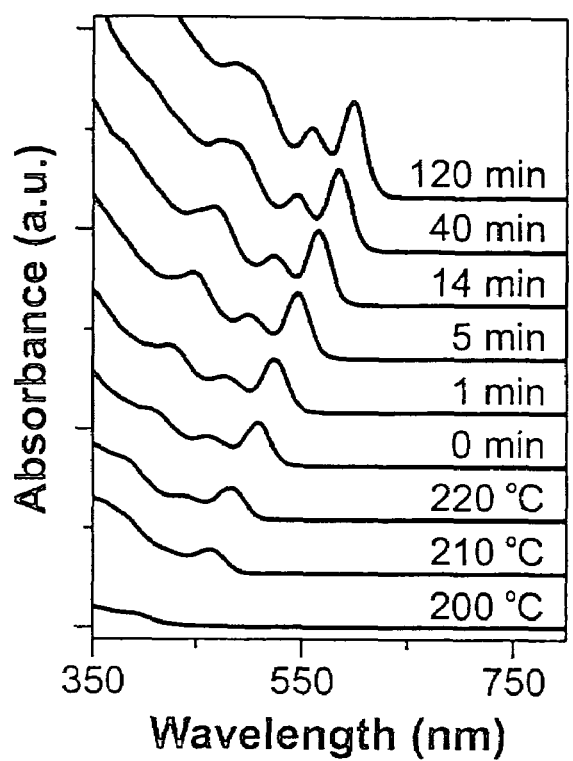
FIG. 2(a) shows the temporal evolution of a UV-Vis absorption spectrum in CdSe synthesis using selenium powder.
Figure 2B:
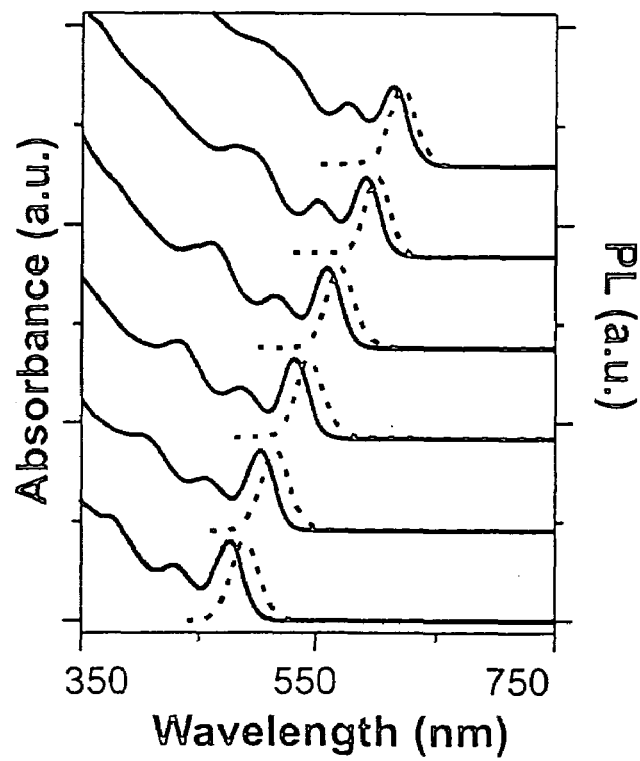
FIG. 2(b) shows absorption (solid line) and PL (dotted line) spectra of the as-synthesized CdSe nanocrystals by using selenium powder with different sizes.

After the temperature reached 240° C., serial aliquots were taken for kinetic studies. The corresponding UV-Vis absorption spectra of aliquots/toluene solution were shown in FIG. 2(a). The measurements were performed on a Shimadzu UV-vis spectrometer (UV Probe 1701). No clusters were detected when the temperature was below 200° C. After the temperature reached 210° C., small particles (i.e., nuclei) appeared. As the particles grew, their size distribution continued to decrease, and a very narrow size distribution was obtained when the temperature reached 240° C. After the particle diameter reached about 3.5 nm (i.e., the first absorption peak at 574 nm), an oleic acid ODE solution (0.05 mmol, 1.0 ml) was added drop-wise into the reaction solution to stabilize the growth of the nanocrystal. Afterward, the narrow size distribution of the nanocrystals could be maintained for at least 16 h while the nanocrystals continued to grow. No measurable secondary nucleation occurred during the growth stage. These results show that the separation of nucleation and growth is automatically achieved in this nanocrystal synthesis. They are highly fluorescent and no surface trap emission was found, shown as FIG. 2(b).

Figure 3A:
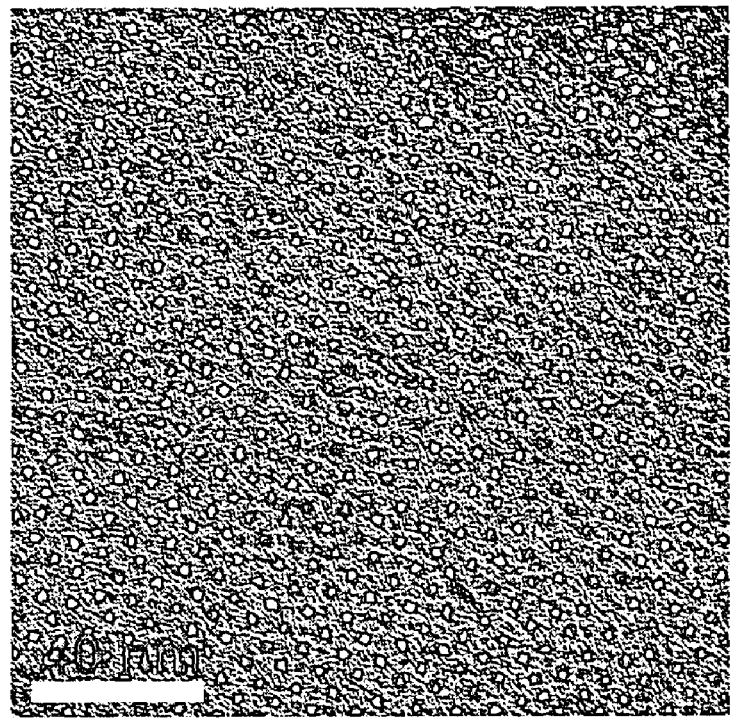
FIG. 3(a) is a scanned TEM image of CdSe nanocrystal made by using selenium powder.
Figure 3B:
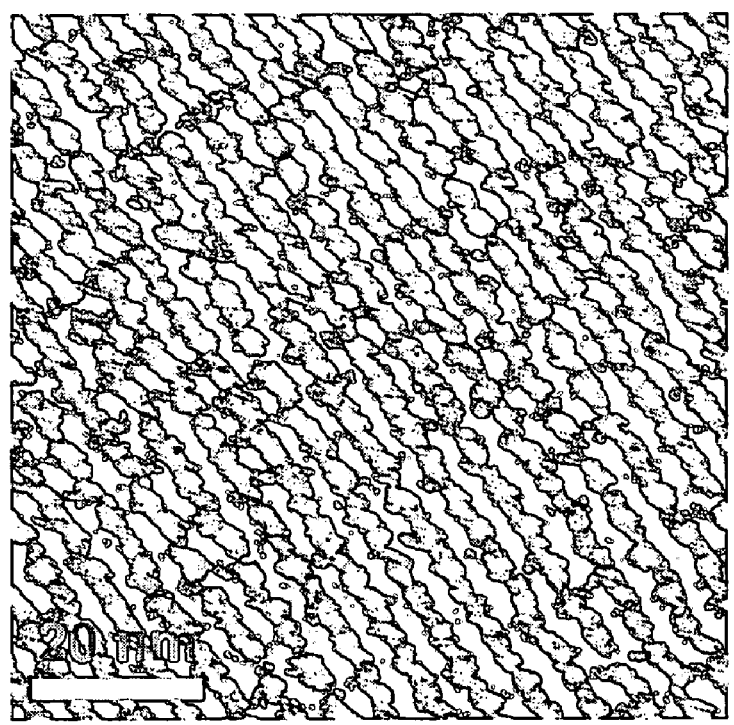
FIG. 3(b) is a scanned TEM image of a CdSe nanocrystal superlattice.

A typical photoluminescence (PL) quantum yield of bandgap emission is about 30% to 40%, compared to 95% of Rodamine-6G dye in ethanol. The fluorescence was measured on a John-Yuvn fluorometer by adjusting their UV-absorbance at the same excitation wavelength is the same (less than 0.05). Without size sorting, nanocrystals herein exhibit up to five exciton absorption bands, indicating their very narrow size distributions. The TEM measurement shown in FIG. 3(a) corroborates this result, which shows a <5% standard deviation (σ) of size distribution (average size of 4.0 nm). The TEM sample were made by dropping nanocrystal solution (in a mixture of toluene and hexane) onto 300 mesh or 400 mesh copper grids, and kept in vacuum after drying. FIG. 3(b) shows a large area highly ordered superlattice, implying the narrow size distribution as well, since formation of a superlattice is known to require a high degree of monodipersity. Altogether, these results show that the quality of the CdSe made by this non-injection method is at least comparable with that of those best particles made by the injection method. It is noted that the Se powder method also well applies to the cadmium oleate and cadmium stearate precursors.

Figure 4A:
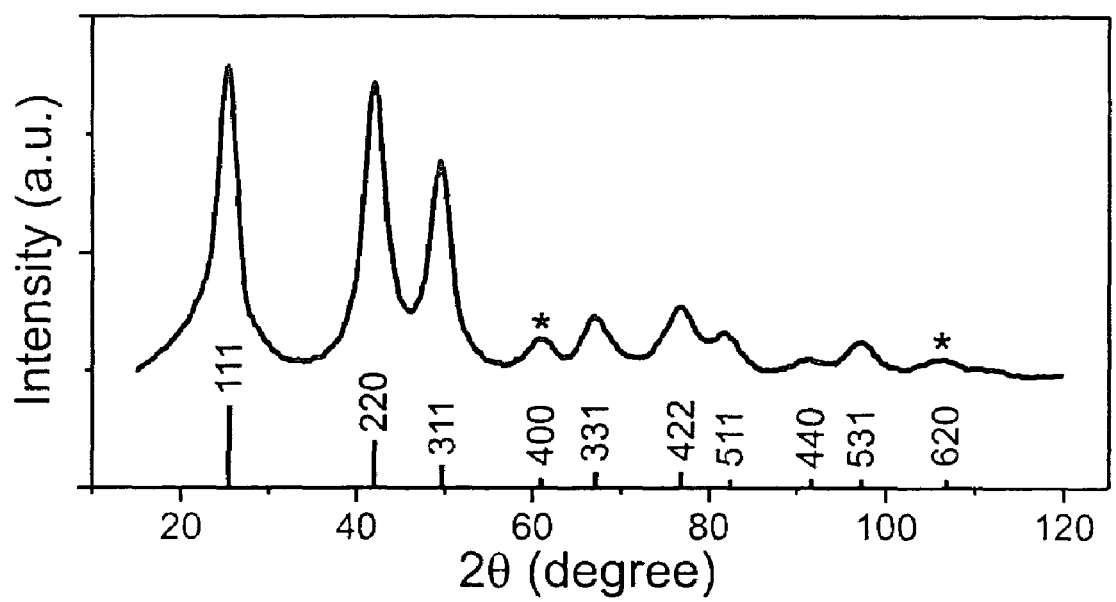
FIG. 4(a) is an XRD pattern of CdSe nanocrystal monolayer made by using selenium powder.
Figure 4B:
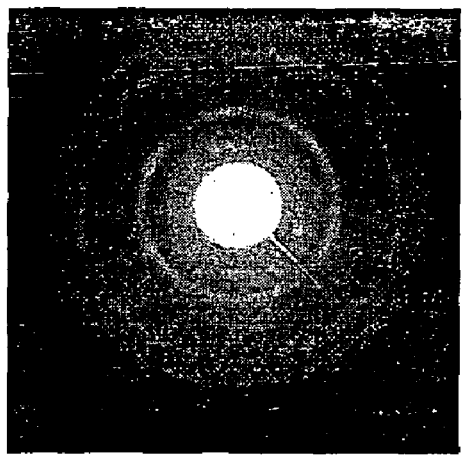
FIG. 4(b) is a scanned selected area electron diffraction (SAED) pattern of a CdSe nanocrystals superlattice.

FIG. 4(a) is an X-ray powder diffraction (XRD) pattern of the CdSe nanocrystals made by the inventive non-injection method. It clearly points to the zinc blende structure, because (i) the valley between the (220) and (311) is deep; (ii) the (400) peak is shown at 61.0°; and (iii) the (620) peak is at 106.2°, but in the case of wurtzite crystals, no strong peaks appear in these positions. This structural assignment is consistent with the high-resolution TEM (HRTEM) observation (JEOL-JEM 2010 operated at 200 kV). An orthogonal-cross-fringe pattern shown in the high-resolution image represents an ordered distance of 0.22 nm, corresponding to the lattice spacing of the (220) faces in zinc-blende CdSe. In FIG. 4(b), a selected area electron diffraction (SAED) of CdSe nanocrystals superlattice is provided which shows three diffraction circles corresponding to lattice spacing of 0.22 nm, 0.18 nm and 0.15 nm, which are quite consistent with (220), (311) and (400) faces of zinc blende CdSe structure.

Example 2

CdSe Nanocrystals Syntheses with Additional Myristic Acid

Figure 5:
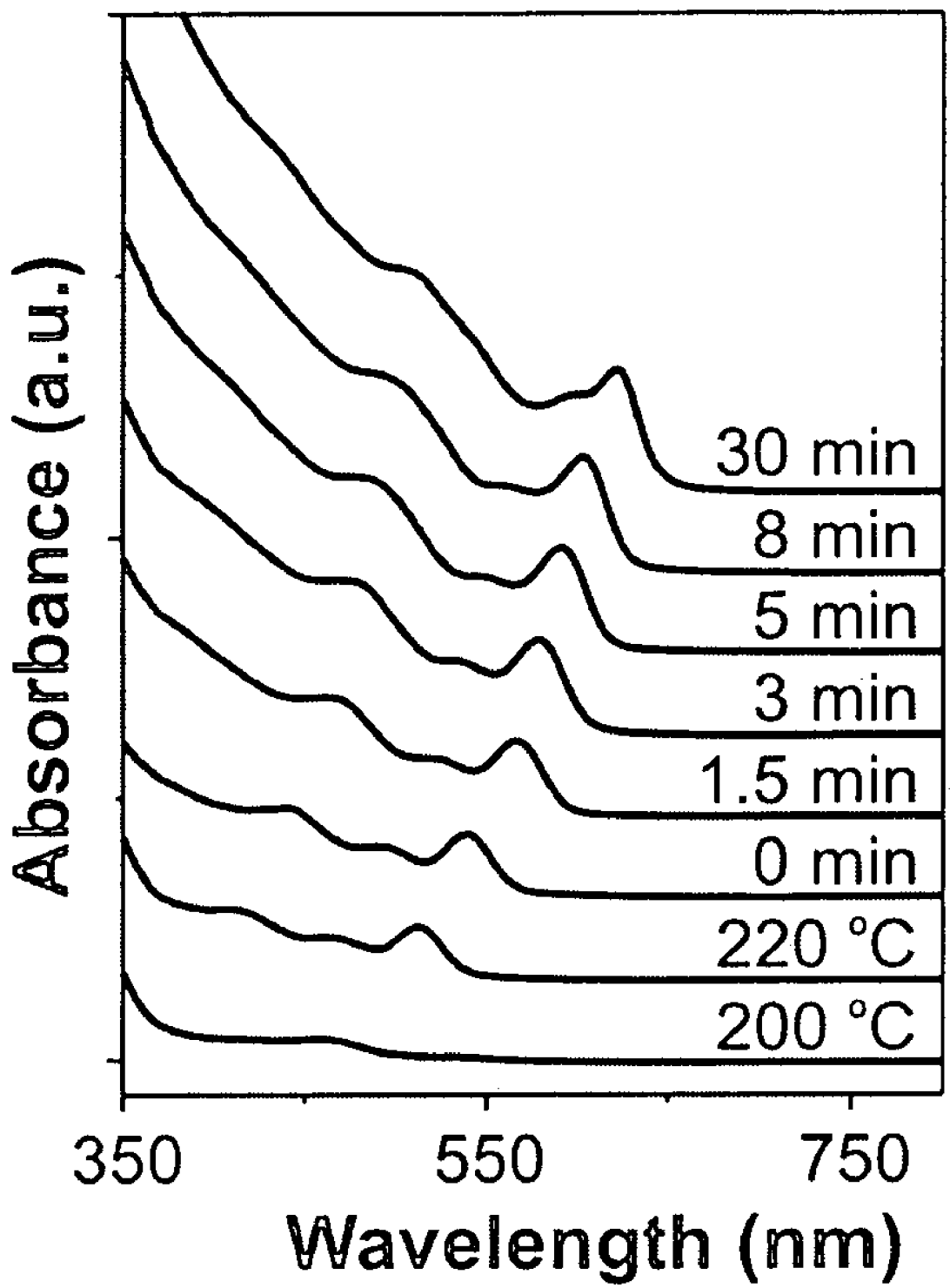
FIG. 5 shows the temporal evolution of UV-Vis absorption spectrum in CdSe synthesis using selenium powder and one portion of additional myristic acid.

In a standard nitrogen-protected glove box, 4.0 mg of selenium powder (0.05 mmol, 99.99%, 100 mesh) and 5.0 g 1-octadecene (ODE) were mixed in a 25 ml three-neck flask. The mixture solution was stored inside at room temperature for 24 hours. Then the flask was taken out of glove box and further added with 56.7 mg of cadmium myristate (0.1 mmol) and 0.284 g of myristic acid (0.1 mmol). Myristic acid is also known as tetradecanoic acid, having the chemical formula: $CH_3(CH_2)_{12}COOH$. After that, the flask was connected to Schlenke line and the mixture solution was degassed for 10 min under vacuum (~30 mTorr) at room temperature. Under an argon flow and with stirring, the solution was heated to 240° C. at a rate of 25° C./min. After the temperature reached 240° C., serial aliquots were taken for kinetic studies. The corresponding UV-Vis absorption spectra of aliquots/toluene solution were shown in FIG. 5. Clearly, the exciton absorption peak shifts significantly faster (e.g., from 539 nm at 0 min to 591 nm at 5 min) than in the case of without additional myristic acid (from 509 nm to 547 nm, respectively, see FIG. 2(b)). Table 1 below illustrates a detailed and intuitive comparison of the absorbance intensity and reaction time needed to reach the same size of CdSe nanocrystals between with and without additional myristic acid cases. This table indicates that faster growth speed is accompanied by smaller absorbance intensity because of additional myristic acid, and vice versa.

TABLE 1

Comparison of the absorbance intensity and reaction time needed to reach the same size of CdSe nanocrystals between with and without additional myristic acid cases.

| λ (nm) | | 540 | 566 | 578 | 591 |
|---|---|---|---|---|---|
| Size (nm) | | 2.9 | 3.4 | 3.7 | 4.1 |
| MA/Cd = 0:1 | Abs (a.u.) | 0.135 | 0.166 | 0.186 | 0.228 |
| | Time (min) | 3 | 14 | 25 | 40 |
| MA/Cd = 1:1 | Abs (a.u.) | 0.079 | 0.081 | 0.105 | 0.113 |
| | Time (min) | 0 | 1.5 | 3 | 5 |

* The absorbance intensity (Abs) is measured with the same amount (50 µl) of aliquot solution in 1 ml toluene.

Example 3

CdTe Nanocrystal Synthesis

Cadmium oxide powder (0.1 mmol) and octadecylphosphonic acid (ODPA, 0.22 mmol) were mixed with 1-octadecene (ODE, 5.0 g, from Aldrich) in a 25 ml three-neck flask. The mixture solution was degassed for 10 min under vacuum (~30 mTorr) at room temperature. Under argon flow, the solution was heated to 300° C. Within the first 40 min, the solution was not stirred, whereas it was stirred within the second 40 min. Brown CdO powder disappeared and a colorless solution was obtained. Then the system was degassed under vacuum at 150° C. for 10 min in order to remove any remaining water generated in the previous step. After that, the system was aged at room temperature for 2 hours. 0.282 ml TBPTe (tributylphosphine telluride, 0.2 mmol tellurium in 0.23 g of TBP-tributylphosphine) was mixed at room temperature with the Cd-ODPA (octadecylphosphonic acid, cadmium salt) complex produced as above described. After 5 min degassing, the mixture solution was heated to 240° C. at a rate of 25° C./min. A series of aliquots solutions were taken to study the growth kinetics of CdTe nanocrystals. No clusters formed when the temperature was below 190° C. After the temperature reached 200° C., small particles (i.e., nuclei) appeared. In contrast to CdSe nanocrystal synthesis, there was no need to add oleic-acid during the CdTe nanocrystal synthesis.

Figure 6A:
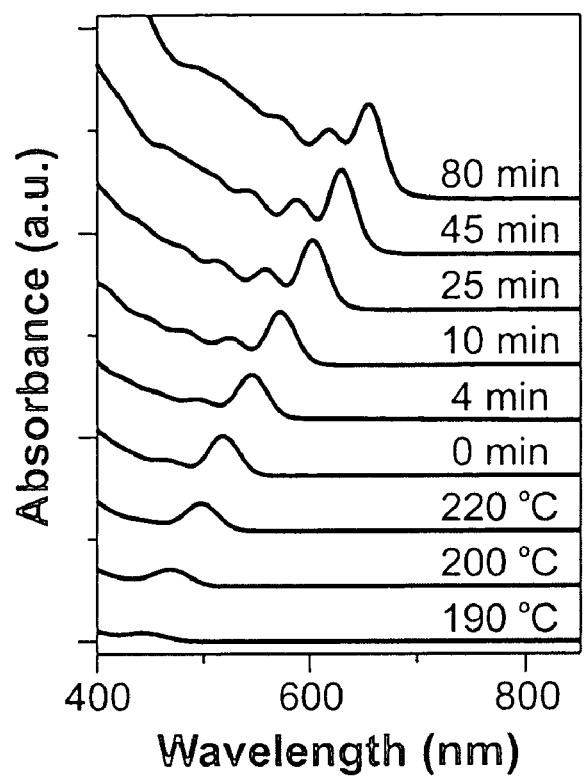
FIG. 6(a) shows the temporal evolution of the UV absorption spectra of CdTe nanocrystals.
Figure 6B:
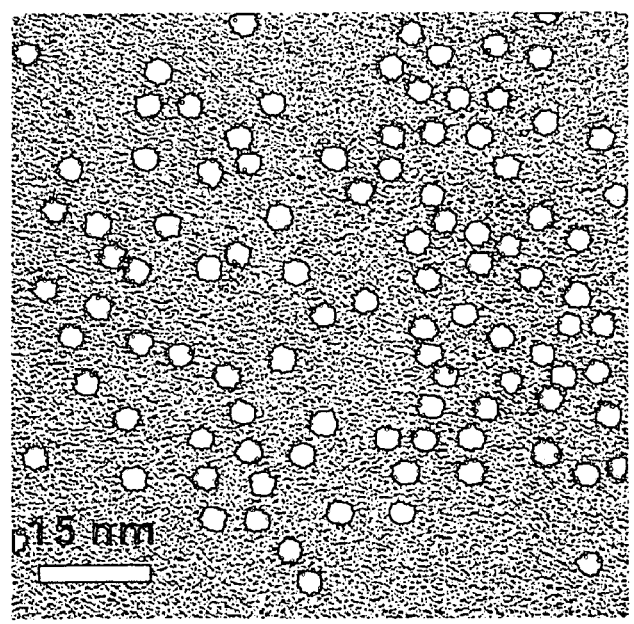
FIG. 6(b) shows a scanned TEM image CdTe nanocrystals.

FIG. 6(a) shows the temporal evolution of the UV absorption spectra of CdTe nanocrystal growth. Clearly, the first exciton transition peak is sharp and narrow (half width at half maximum is 13~14 nm) throughout the growth process, which indicates a very narrow size distribution or high monodispersity. Moreover, up to five exciton transition peaks were detected, which also evidences high nanocrystal quality (good size distribution and optical properties). This result is consistent with the scanned TEM image shown in FIG. 6(b), in which CdTe nanocrystals are highly uniform in size (~4.0 nm) and morphology (spherical).

Figure 7A:
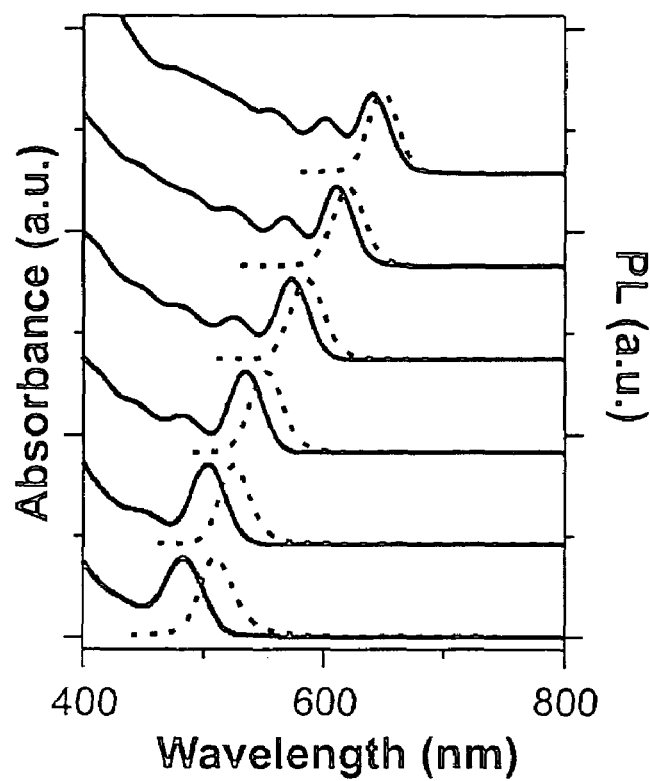
FIG. 7(a) shows UV absorption (solid line) and fluorescence (dotted line) of as-prepared CdTe nanocrystals.
Figure 7B:
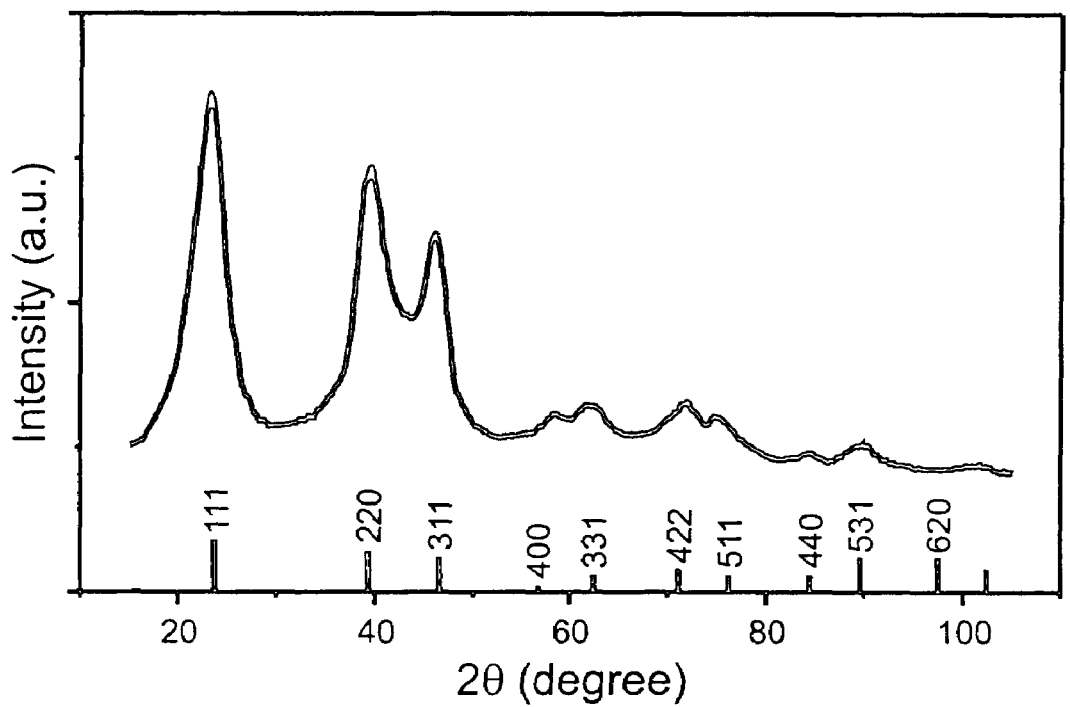
FIG. 7(b) is an XRD pattern from CdTe nanocrystals.

FIG. 7(a) shows the UV absorption (solid line) and fluorescence (dotted line) of as-prepared CdTe nanocrystals, implying its good optical properties. From the XRD pattern of CdTe nanocrystals shown in FIG. 7(b), it is hard to make an unambiguous conclusion on the crystal structure because of some conflicting features. Specifically, a) the valley between (220) and (311) is high, resembling Wurtzite structure or Wurtzite defects; b) no peak or band corresponding to (620) of Zinc Blende structure shows up at about 97.4°; c) there is no pronounced peak or band at about 32.7° corresponding to (102) face of Wurtzite phase; d) the peak at 58.2° is between (400) face of Zinc Blende and (203) face of Wurtzite; and e) the ratio of peak intensity between 58.2° and 62.3° is consistent with that of Zinc Blende structure. It is noted that the standard XRD pattern of Wurtzite CdTe does not list any peak higher than 100°.

Example 4

ZnS Nanocrystal Synthesis

Figure 8:
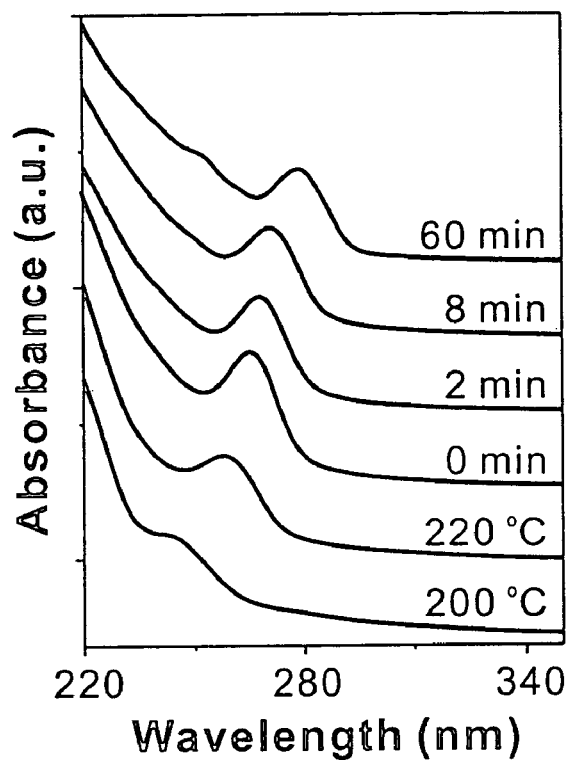
FIG. 8 shows temporal evolution of UV-Vis absorption spectrum in ZnS synthesis using mixture solvents of $C_8OC_8$ (di-octyle ether 2.0 g) and $C_{18}$ (Octadecane 3.0 g).

Zinc stearate (0.1 mmol) and sulfur powder (0.05 mmol) were mixed, in the presence of dodecanethiol ($C_{12}SH$, 0.1 mmol) with octyl ether ($C_8OC_8$, 2.0 g) and octadecane ($C_{18}$, 3.0 g) in a 25 ml three-neck flask. The mixture solution was degassed for 10 min under vacuum (~30 mTorr) at room temperature. Under argon flow, the solution was heated to 240° C. at a rate of 25° C./min. At 200° C. there is already a detectable absorption peak at ca. 244 nm, as seen in FIG. 8, indicating formation of ZnS nanocrystals. The UV-Vis spectra are very similar to those made by injection method. Subsequently, the growth temperature was kept at 240° C. The nanocrystals can finally grow to the maximal size with the first absorption peak at 278 nm after 50 min. it is noted that ZnS nanocrystal synthesis can also be run in a sole solvent of 1-Octadecene (ODE, 5.0 g) or of octylether ($C_8OC_8$, 5.0 g)

Example 5

ZnSe Nanocrystal Synthesis

Figure 9:
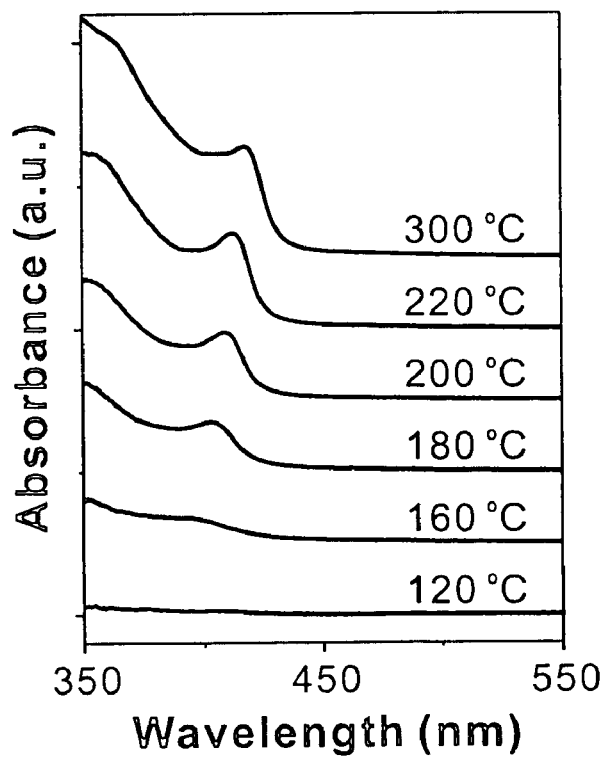
FIG. 9 shows temporal evolution of UV-Vis absorption spectrum in ZnSe synthesis.

Zinc myristate (0.125 mmol) and selenium powder (0.0625 mmol, 100 mesh) were mixed with 1-octadecene (ODE, 6.26 g) in a 25 ml three-neck flask. The mixture solution was degassed for 10 min under vacuum (~30 mTorr) at room temperature. Under argon flow, the solution was then heated to 300° C. ZnSe nanocrystals were formed with temperature increasing, which is indicated by temporal evolution of their UV absorption spectrum as shown in FIG. 9. The UV-Vis spectra are similar to those made by injection method.

Example 6

CdZnS Nanocrystal Synthesis

Figure 10:
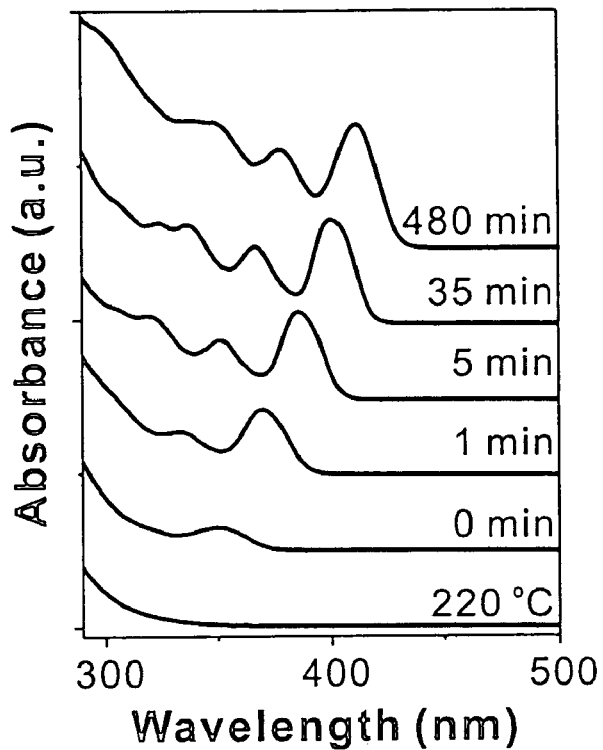
FIG. 10 shows temporal evolution of UV-Vis absorption spectrum in CdZnS synthesis.

Cadmium myristate (0.1 mmol,) Zinc myristate (0.02 mmole) and sulfur powder (0.05 mmol) were mixed with 1-octadecene (ODE, 5.0 g, from Aldrich) in a 25 ml three-neck flask. The mixture solution was degassed for 10 min under vacuum (~30 mTorr) at room temperature. Under argon flow, the solution was then heated to 240° C. The corresponding UV-Vis spectra with CdZnS nanocrystals growth are shown in FIG. 10.

Example 7

CdMnS Nanocrystal Synthesis

Figure 11:
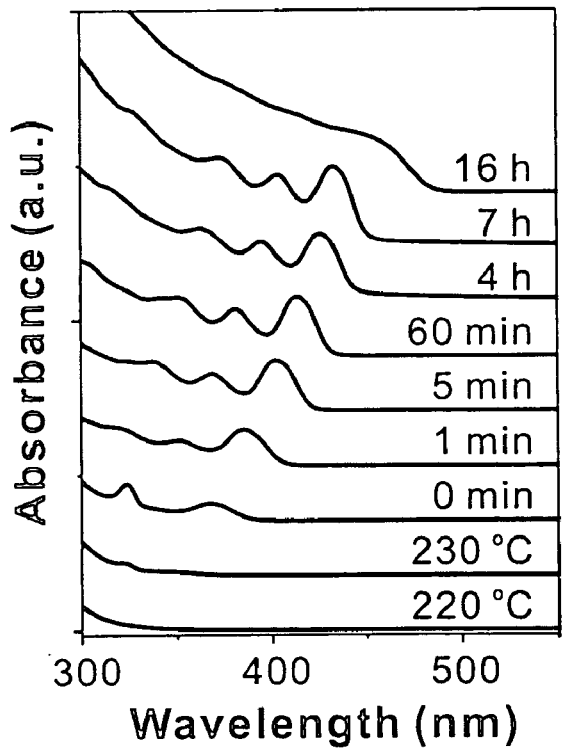
FIG. 11 shows Temporal evolution of UV-Vis absorption spectrum in MnCdS synthesis.

Cadmium myristate (0.095 mmol,), mangeneous acetate (0.005 mmole) and sulfur powder (0.05 mmol) were mixed with 1-octadecene (ODE, 5.0 g) in a 25 ml three-neck flask. The mixture solution was degassed for 10 min under vacuum (~30 mTorr) at room temperature. Under argon flow, the solution was then heated to 240° C. A series of aliquots solution were taken for the kinetics study by measuring their UV-Vis spectra, as shown in FIG. 11.

Example 8

EuCdS Nanocrystal Synthesis

Figure 12:
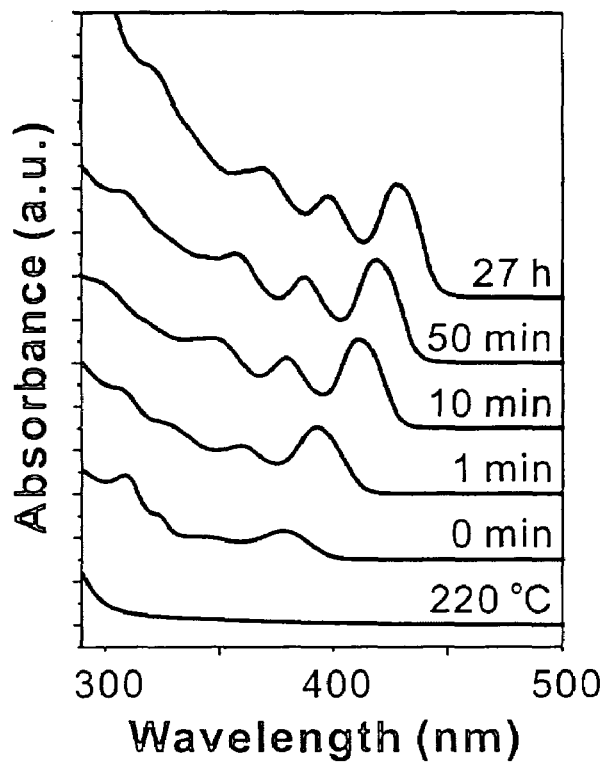
FIG. 12 Temporal evolution of UV-Vis absorption spectrum in EuCdS synthesis.

Cadmium myristate (0.095 mmol,) Europium acetate (0.005 mmol) and sulfur powder (0.05 mmol) were mixed with 1-octadecene (ODE, 5.0 g) in a 25 ml three-neck flask. The mixture solution was degassed for 10 min under vacuum (~30 mTorr) at room temperature. Under argon flow, the solution was then heated to 240° C. A series of aliquots solution were taken for the kinetics study by measuring their UV-Vis spectra, results shown in FIG. 12.

Example 9

EuCdSe Nanocrystal Synthesis

Figure 13:
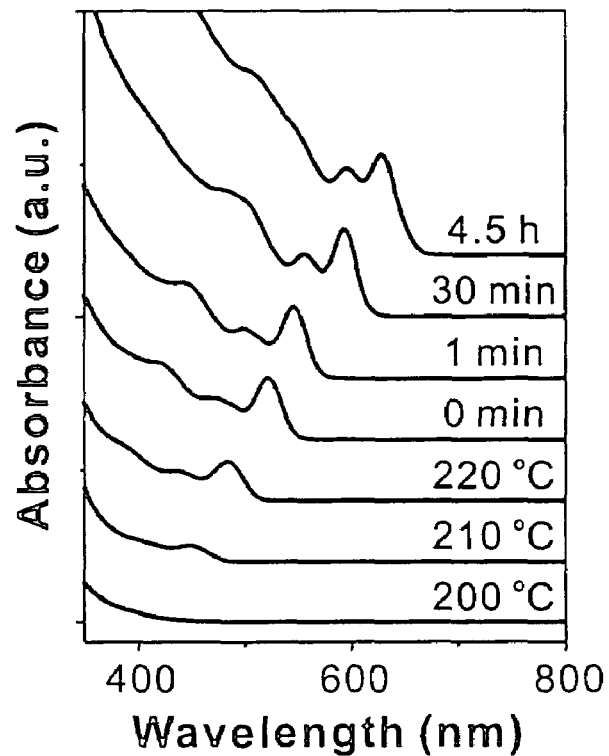
FIG. 13 shows temporal evolution of UV-Vis absorption spectrum in EuCdSe synthesis.

Cadmium myristate (0.095 mmol,) Europium acetate (0.005 mmole) and sulfur powder (0.05 mmol) were mixed with 1-octadecene (ODE, 5.0 g) in a 25 ml three-neck flask. The mixture solution was degassed for 10 min under vacuum (~30 mTorr) at room temperature. Under argon flow, the solution was then heated to 240° C. A series of aliquots solution were taken for the kinetics study by measuring their UV-Vis spectra, results shown in FIG. 13.

Examples below describe syntheses of II-VI group nanocrystals by non-injection methods including the addition of one or more optional nucleation initiators.

Example 10

CdS Using Initiators

In a typical process, cadmium acetate hydrate (0.1 mmol, from Aldrich), myristic acid (0.2 mmol), and octadecene (ODE) solutions (a non-coordinating solvent) with sulfur (0.05 mmol), $I_1$ (6.25 μmol), and $I_2$ (3.13 μmol) were respectively added into a three-neck flask with ODE (the ratio of $S:I_2=1:\frac{1}{16}$, and total amount of ODE=5 g). The mixture solution was heated at 120° C. with gentle stirring under vacuum (30 mTorr). A clear solution was obtained after 2 h. Under an Ar flow, the resulting solution was heated to 240° C. at a rate of 10° C./min. After the temperature reached 240° C., serial aliquots were taken for kinetic studies.

Figure 14:
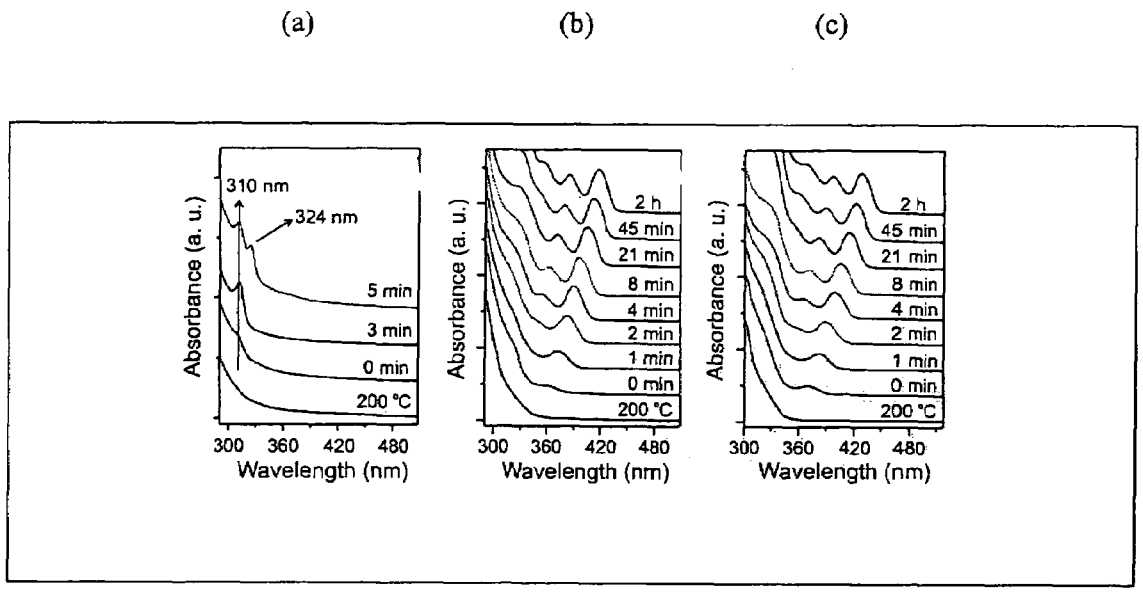
FIGS. 14(a), (b) and (c) show temporal evolution of the absorption spectrum of CdS nanocrystal growth at the ratio of S:dithiobisbenzothiazole of 1:0, 1:1/16 and 1:1/8, respectively.

FIGS. 14(a)-(c) show that no detectable nucleation occurred when the temperature was below 200° C., whether nucleation initiators were used or not. In the CdS synthesis performed, two types of stable clusters were found, with the first having absorption peaks at 310 nm and 324 nm as shown in FIG. 14(a). FIG. 14(a) show temporal evolution of the absorption spectrum of CdS nanocrystal growth at the ratio of S:dithiobisbenzothiazole of 1:0 (no $I_2$). These clusters likely function as reservoirs for generating active monomers. However, the rate of consumption of these clusters was found to be very low, which caused the clusters to accumulate in the reaction solution and finally led to a large amount of white precipitates. This result is partly because of the low reactivity of monomers released from the reservoir. To adjust the reactivity of the monomers, nucleation initiators were applied.

FIGS. 14(b) and (c) show temporal evolution of the absorption spectrum of CdS nanocrystal growth at the ratio of S:dithiobisbenzothiazole of $1:\frac{1}{16}$ and $1:\frac{1}{8}$, respectively. As shown in FIG. 14(b) as the particles grew, their size distribution was seen to continue to decrease, and a very narrow size distribution was reached after 4 min. The subsequent growth kinetics was similar to that known for injection-based synthesis. Here, the narrow size distribution of particles can be maintained for at least 12 h while nanocrystals continue to grow in size. No detectable new nucleation occurred during particle growth, and the concentration of nanocrystals in the reaction solution was kept nearly unchanged. Taken together, these results demonstrate that the nucleation and growth stages are clearly separate in the non-injection-based synthesis method according to the invention.

The nucleation initiators ($I_1$ and $I_2$) are believed to play an important role in this synthesis, partly because they appear to affect the reactivity of the precursors used to form CdS, cadmium myristate and S. Without these initiators, a large quantity of white precipitate was often obtained in the synthesis after the temperature reached 240° C. On the other hand, increasing the amount of $I_2$ led to faster CdS nanocrystal growth, but the general kinetic feature of the nucleation and growth stages stayed unchanged (as shown in FIG. 14(c)).

Figure 15:
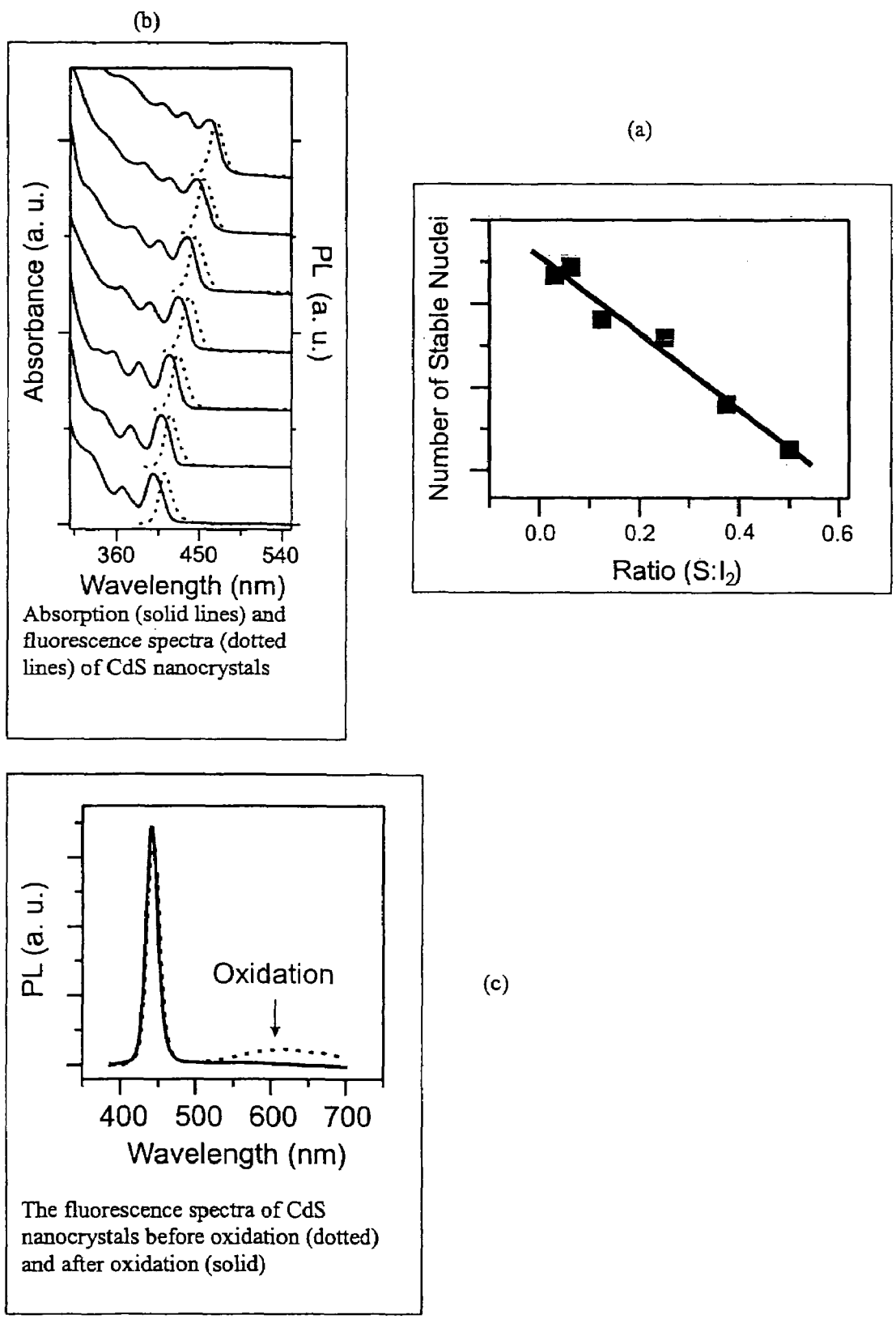
FIGS. 15(a), (b) and (c) show the number of stable nuclei in the synthesis with different $S:I_2$ ratios, PL spectra of CdS nanocrystals before and after oxidation, and Absorption and PL (in red) spectra of the as-prepared CdS nanocrystals with different sizes, respectively.

In addition, the amount of $I_2$ was found to affect the number of stable nuclei. The greater the amount of $I_2$, the smaller the number of stable nuclei found in the synthesis (as shown in FIG. 15(a)). Importantly, this result allows the final particle sizes to be easily controlled. With the same amount of precursor, a smaller number of nuclei resulted in nanocrystals with a larger final size, and vice versa. For example, a reaction with a $S:I_2$ ratio of $1:\frac{3}{8}$ yielded large particles with a first absorption peak at 460 nm and a tight size distribution (as shown in FIG. 15(c)).

The quality of the CdS nanocrystals formed by this method is at least comparable to that of the best CdS nanocrystals made by conventional injection-based methods. After non-size-sorting separation, the CdS nanocrystals exhibit up to four absorption peaks, indicating their very narrow size distributions (as shown in FIG. 15(c)). However, the photoluminescence (PL) of the CdS nanocrystals still contains a noticeable quantity of surface-trap emission analogous to particles made by the injection method (as shown in FIG. 15(b) with the dotted line).

Example 11

Optical Properties and Crystal Structure of CdS Formed as Described in Example 10

Another aspect of the invention relates to a method for reducing surface trap emission density of semiconducting nanocrystals. It has been found that a gentle oxidation reaction under laboratory fluorescent lights (e.g. (365 nm with 470 μW) essentially eliminated the surface-trap emission of the CdS nanocrystals. The quantum yield of the band-gap emission after oxidation according to the invention was found to be enhanced up to 12%, as shown in FIG. 15(c) by the flat solid line in FIG. 15(c) between about 500 and 700 nm.

Such quantum yield is two to three times higher than the best reported yields for CdS nanocrystals. Using this oxidation processing method, different-sized monodisperse CdS nanocrystals were prepared without measurable surface-trap emission, with the first absorption peaks of these particles ranging from 400 nm to 460 nm (as shown in FIG. 15(c)).

The CdS nanocrystals made using the invention were found to have a different crystal structure than those made by the precursor injection method (zinc blende vs. wurtzite, respectively). Although these two crystal phases could produce similar X-ray powder diffraction (XRD) results in nanocrystals, the XRD pattern herein shows the following unambiguous evidence that the CdS nanoparticles according to the invention are of a zinc-blende structure:

(a) The (200) diffraction is clearly shown as a shoulder at 30°;
(b) The valley between the (220) and (311) is deep; and
(c) The (531) peak is shown at 103°, but in the case of wurtzite crystals, the strong peak should appear at 107° (215) in this high-angle regime (see FIG. 16(a)).

This structural assignment is consistent with the TEM observation (JEOL-JEM 2010 operated at 200 kV). The nanocrystals with a first absorption peak at 456 nm appeared as cubes with an edge length of 3.8 nm and a standard deviation (σ) of 7% (as shown in FIG. 16(b)). A cubic shape is very easily formed for the zinc-blende crystals, which are enclosed by {100} faces, but not for the wurtzite ones (see FIG. 16(a) insert).

Figure 16:
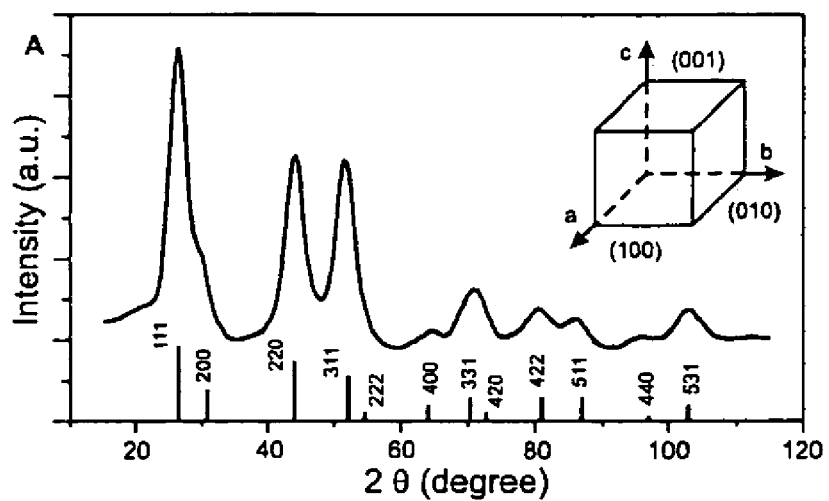
FIG. 16(a) is an XRD pattern of the CdS crystals with a first absorption peak at about 456 nm with the standard diffraction peak positions and relative intensities of bulk zinc-blende CdS indicated, while FIGS. 16(b) and (c) are scanned TEM images of monolayers and superlattices of the CdS nanocrystals, respectively. The insert in FIG. 16(c) illustrates a scanned ED pattern taken in the same area.
Figure 16:
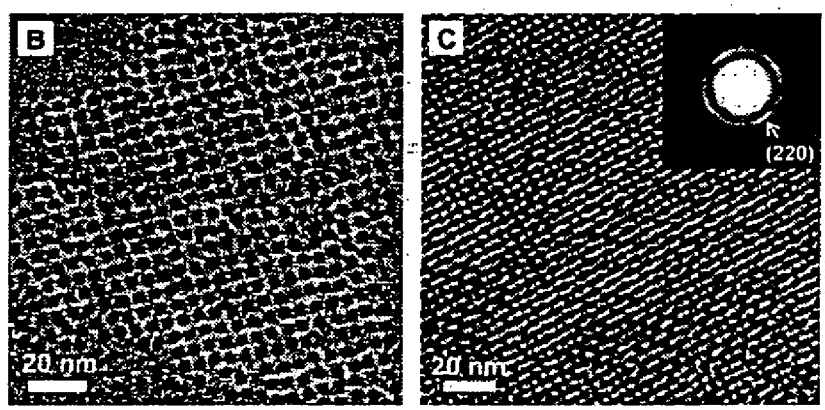

Moreover, the results obtained using electron diffraction (ED) provides further evidence for the zinc-blende crystal phase. The high degree of size uniformity of these cubic nanocrystals allows the nanocrystals to be heated under vacuum to self-assemble the nanocrystals into close-packed, ordered nanocrystal superlattices (colloidal crystals). Superlattices with sizes up to a few microns were generated by slow evaporation of a concentrated nanocrystal solution (toluene:hexane=1:1) on TEM grids (as shown in FIG. 16(*c*)). One set of 4 orthogonal-aligned diffraction spots shown in the ED represents an ordered distance of 0.21 nm, corresponding to the lattice spacing of the (220) faces in zinc-blende CdS. In contrast, a set of 6 hexagonal-aligned diffraction spots should be expected for the counterpart of zinc-blende (220) faces—the (110) faces in a wurtzite structure.

Example 12

Use of $I_1$ (Tetraethylthiuram Disulfides)

Figure 17:
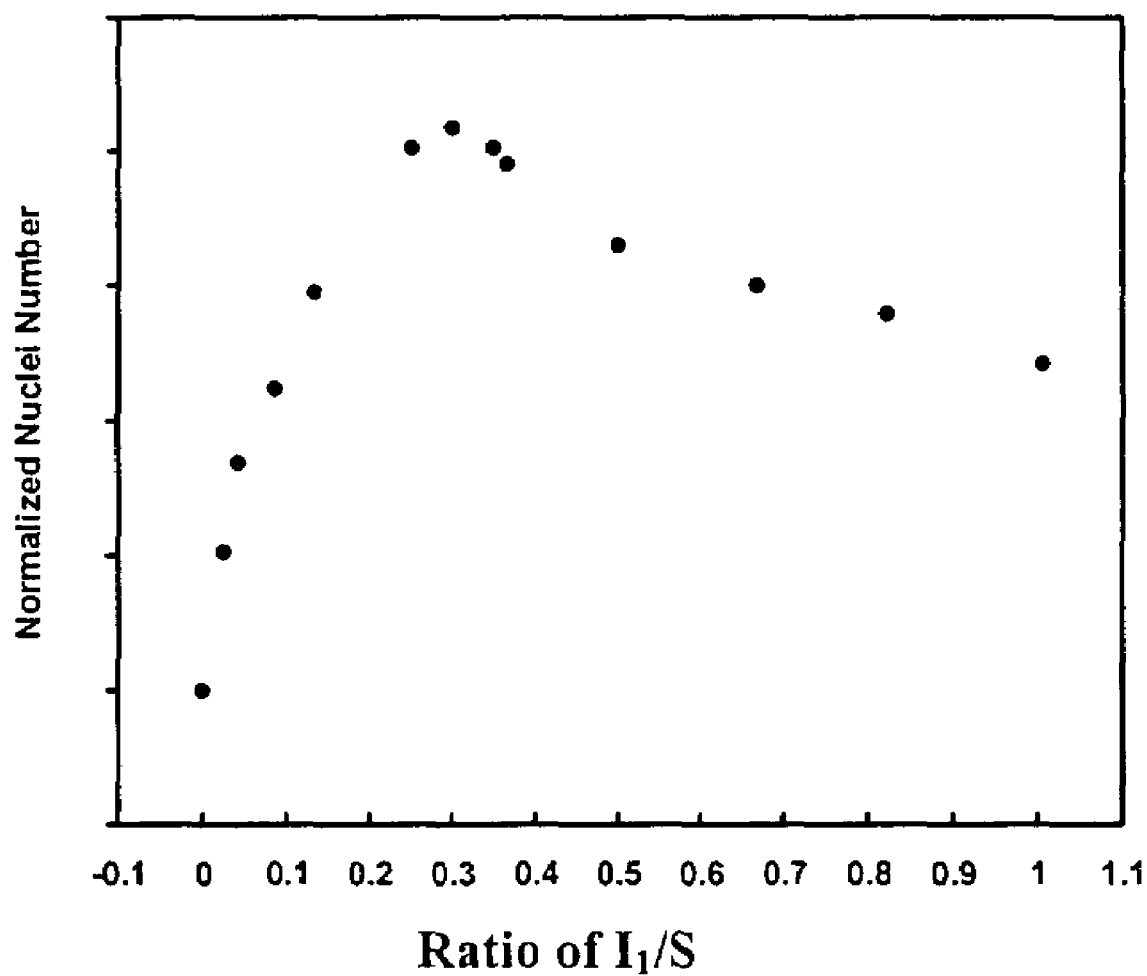
FIG. 17 shows the number of stable nuclei formed using different $I_1$:S ratios.

In a series of thirteen individual experiments, cadmium myristate (0.1 mmol), sulfur (0.05 mmol) and $I_1$ (varying from 0 to 0.05 mmol in different experiment) were added into a three-neck flask with 5 g ODE. The mixture solution was degassed for 10 min under vacuum (~16 mTorr) at room temperature, and then the vacuum was removed. Under an Ar flow, the solution was heated to 240° C. (25° C./min) with gentle stirring, serial aliquots were taken for kinetic studies after the temperature reached 240° C. The ratios of $I_1$:S were 0, 1:40, 1:24, 1:12, 1:8, 1:4, 3:10, 7:20, 3:8, 1:2, 2:3, 5:6 and 1:1, respectively. In each synthesis, at least six different-sized particles were chosen to evaluate the number of stable nuclei. Then, the number of stable nuclei was normalized with that found in the synthesis when the ratio of $I_1$:S was 0. The relative number of nuclei as a function of the ratio of $I_1$:S is shown in FIG. 17.

Example 13

Use of $I_2$ (2,2'-dithiobisbenzothiazole)

Figure 18:
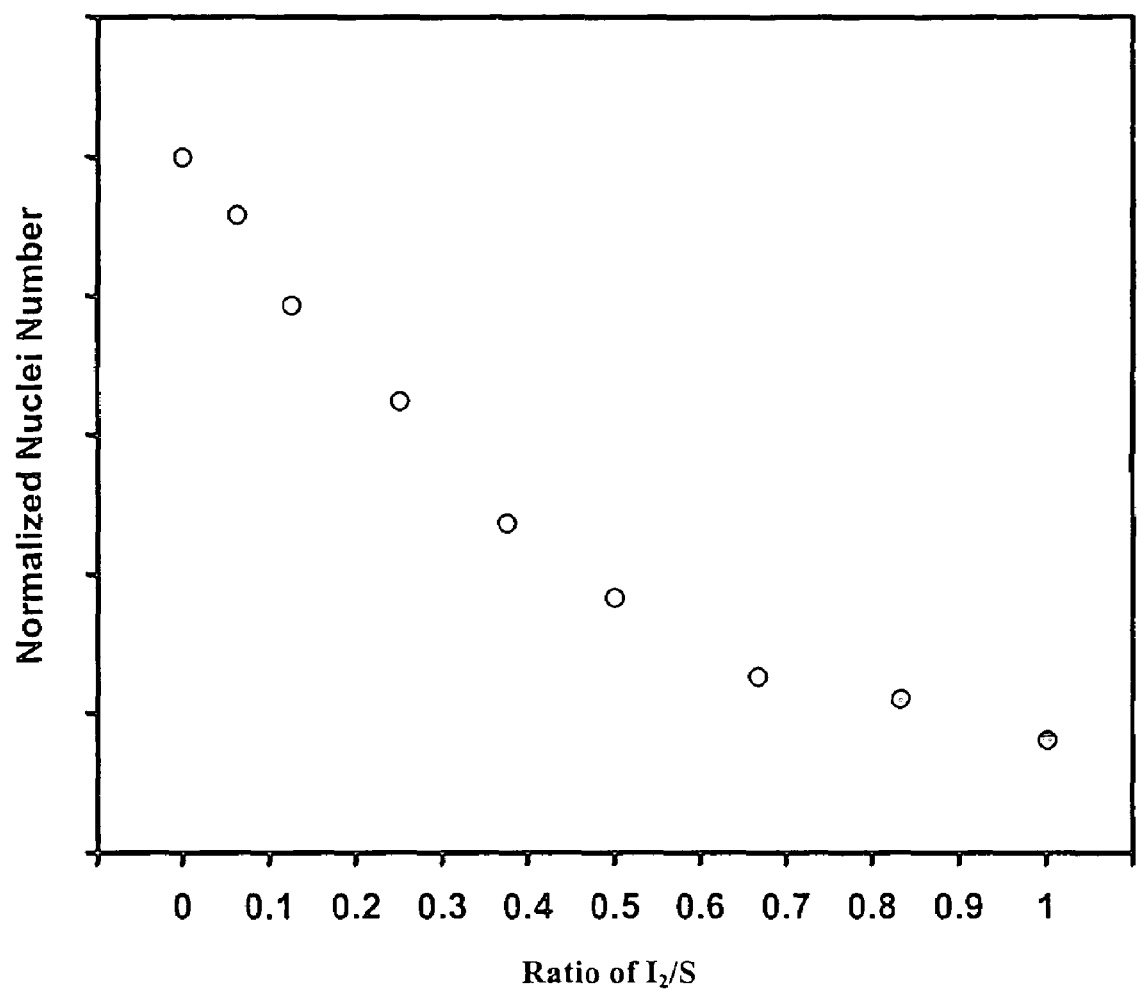
FIG. 18 shows the number of stable nuclei in the synthesis with different $I_2$:S ratios.

In a series of nine individual experiments, cadmium myristate (0.1 mmol), sulfur (0.05 mmol) and $I_2$ (varying from 0 to 0.05 mmol in different experiment) were added into a three-neck flask with 5 g ODE. The mixture solution was degassed for 10 min under vacuum (~16 mTorr) at room temperature, and then the vacuum was removed. Under an Ar flow, the solution was heated to 240° C. (25° C./min) with gentle stirring, serial aliquots were taken for kinetic studies after the temperature reached 240° C. The ratios of $I_2$:S were 0, 1:16, 1:8, 1:4, 3:8, 1:2, 2:3, 5:6 and 1:1, respectively. In each synthesis, at least five different-sized particles were chosen to evaluate the number of stable nuclei. Then, the number of stable nuclei was normalized with that found in the synthesis when the ratio of $I_2$:S was 0. The relative number of nuclei as a function of the ratio of $I_2$:S is shown in FIG. 18. The greater the amount of $I_2$ the smaller the number of stable nuclei found in the synthesis.

Example 14

Use of Myristic Acid

Figure 19:
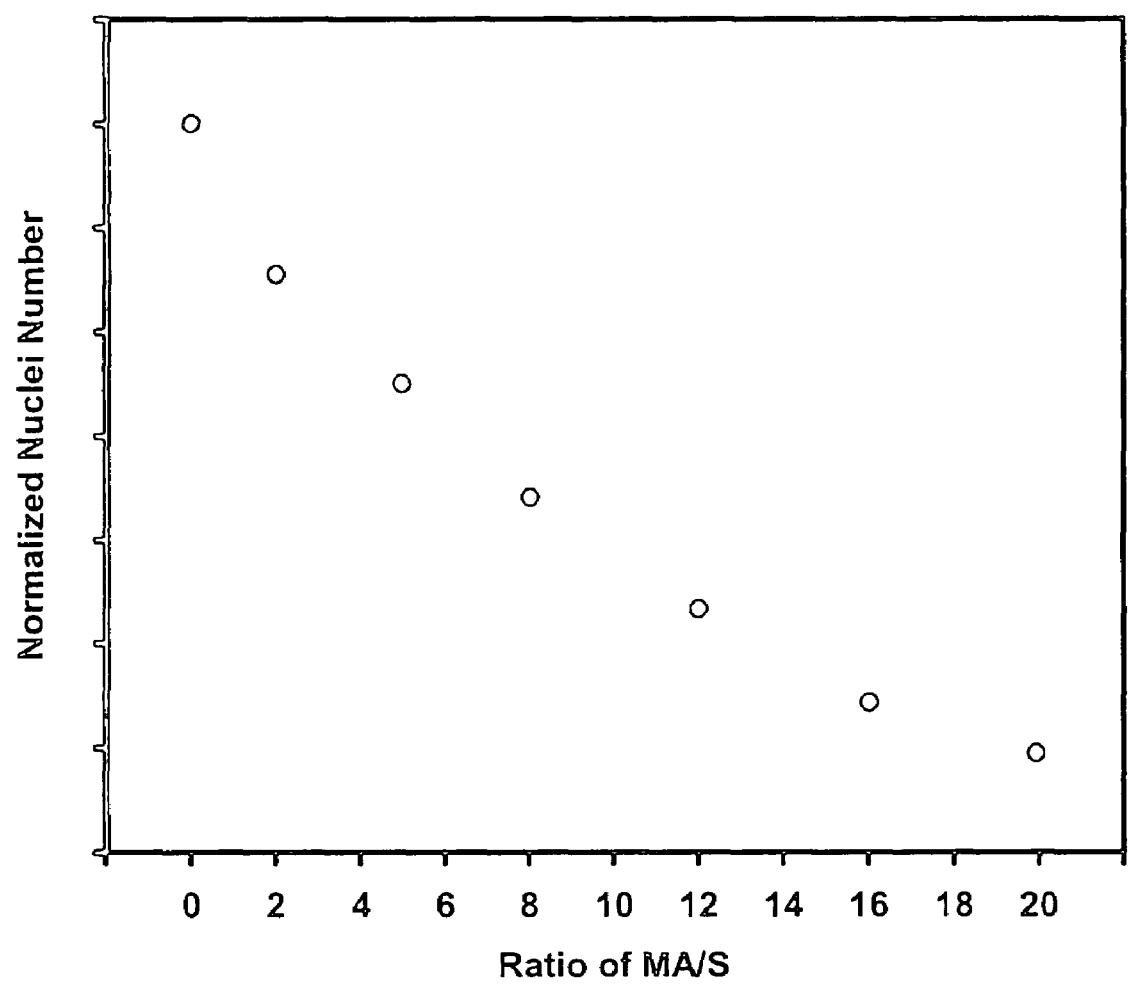
FIG. 19 shows the number of stable nuclei in the synthesis with different MA:S ratios.

In a series of seven individual experiments, cadmium myristate (0.1 mmol), sulfur (0.05 mmol) and myristic acid (varying from 0 to 1 mmol in different experiment) were added into a three-neck flask with 5 g ODE. The mixture solution was degassed for 10 min under vacuum (~16 mTorr) at room temperature, and then the vacuum was removed. Under an Ar flow, the solution was heated to 240° C. (25° C./min) with gentle stirring, serial aliquots were taken for kinetic studies after the temperature reached 240° C. The ratios of MA:S were 0, 2:1, 5:1, 8:1, 12:1, 16:1 and 20:1 respectively. In each synthesis, at least seven different-sized particles were chosen to evaluate the number of stable nuclei. Then, the number of stable nuclei was normalized with that found in the synthesis when the ratio of MA:S was 0. The relative number of nuclei as a function of the ratio of MA:S is shown in FIG. 19.

Example 15

Chain Length of Carbonic Acids Effect

Figure 20:
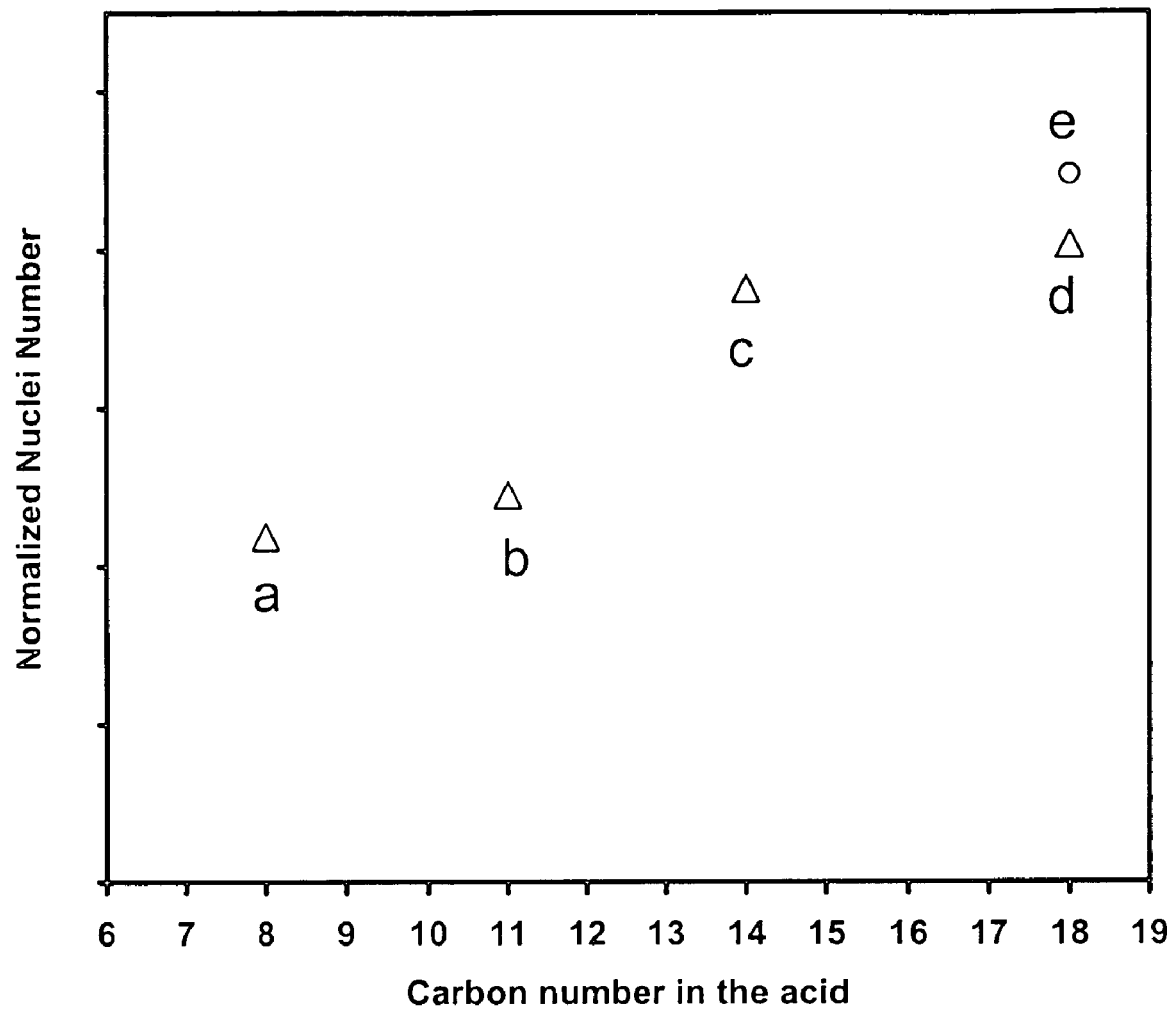
FIG. 20 shows the number of stable nuclei in the synthesis with different carbon chain length of the acid. a: octanoic acid ($C_8$), b: undecanoic acid ($C_{11}$), c: myristic acid ($C_{14}$), d: stearic acid ($C_{18}$), e: oleic acid ($C_{18}$ with a double bond).

Five carbonic acids were used to check the effect of carbon chain length in the acid molecules on the nuclei number: octanoic acid ($C_8$), undecanoic acid ($C_{11}$), myristic acid ($C_{14}$), stearic acid ($C_{18}$), oleic acid ($C_{18}$ with double bond). In a series of five individual experiments, cadmium myristate (0.1 mmol), sulfur (0.05 mmol), $I_2$ (12.5 μmol) and one of the carbonic acid (0.25 mmol) were added into a three-neck flask with 5 g ODE. The mixture solution was degassed for 10 min under vacuum (~16 mTorr) at room temperature, and then the vacuum was removed. Under an Ar flow, the solution was heated to 240° C. (25° C./min) with gentle stirring, serial aliquots were taken for kinetic studies after the temperature reached 240° C. The number of stable nuclei was normalized with that found in the synthesis when the ratio of aid:S was 0. In each synthesis at least seven different-sized particles were chosen to evaluate the number of stable nuclei. It was approved that the shorter carbon chain length of the acid, the faster CdS particle grows and the less number of stable nuclei (FIG. 20).

Example 16

Additive Effect of $I_2$ and MA

Figure 21:
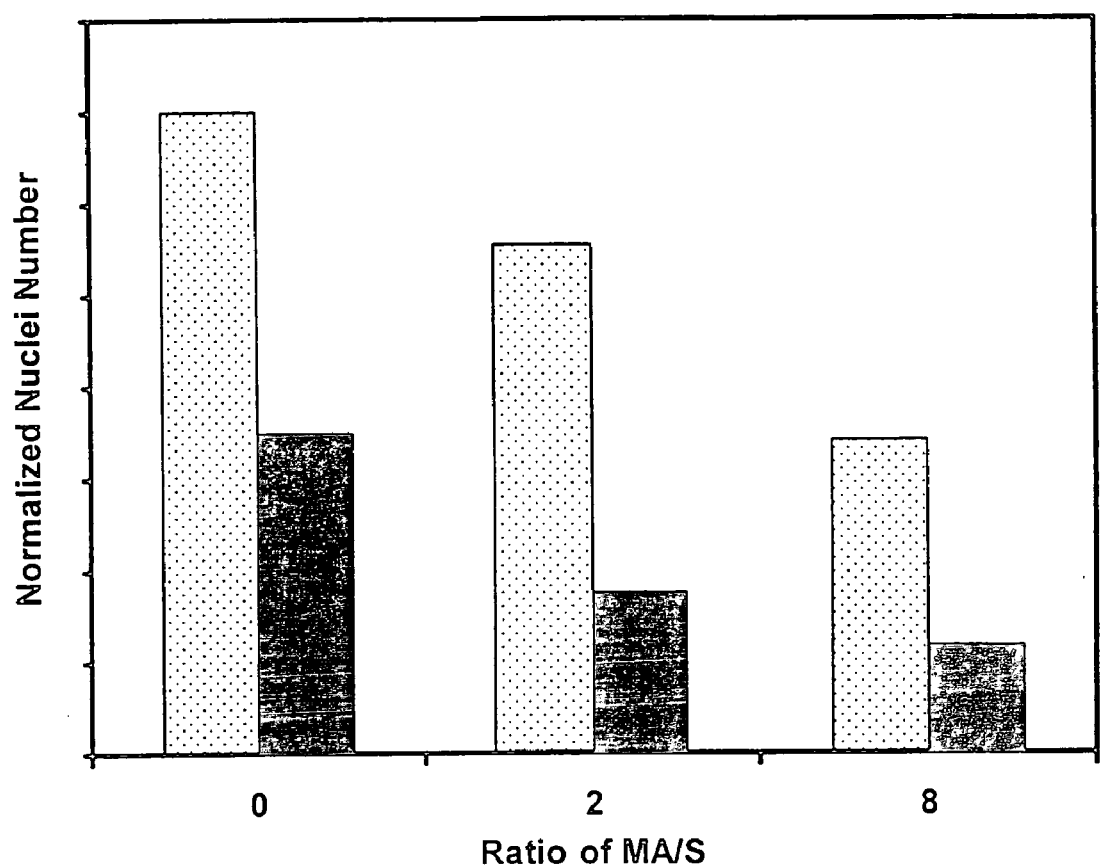
FIG. 21 shows the number of stable nuclei in the synthesis with $I_2$ and myristic acid. Dots: only MA added. Black: MA and $I_2$ both added.

In a series of six individual experiments, cadmium myristate (0.1 mmol), sulfur (0.05 mmol) and $I_2$ (0 or 12.5 μmol) and myristic acid (varying from 0 to 0.4 mmol in different experiment) were added into a three-neck flask with 5 g ODE. The mixture solution was degassed for 10 min under vacuum (~16 mTorr) at room temperature, and then the vacuum was removed. Under an Ar flow, the solution was heated to 240° C. (25° C./min) with gentle stirring, serial aliquots were taken for kinetic studies after the temperature reached 240° C. The ratios of MA:S were 0, 2:1 and 8:1 respectively. The number of stable nuclei was normalized with that found in the synthesis when the ratio of MA:S and $I_2$:S were 0. In each synthesis at least eight different-sized particles were chosen to evaluate the number of stable nuclei. It was found that $I_2$ can work with MA together to accelerate the particle growth, which leads to the number of stable nuclei dramatically decreased (FIG. 21) Their effects on improving CdS particle growth rate are additive.

Example 17

Tetradecylphosphonic Acid (TDPA) Effect

Figure 22:
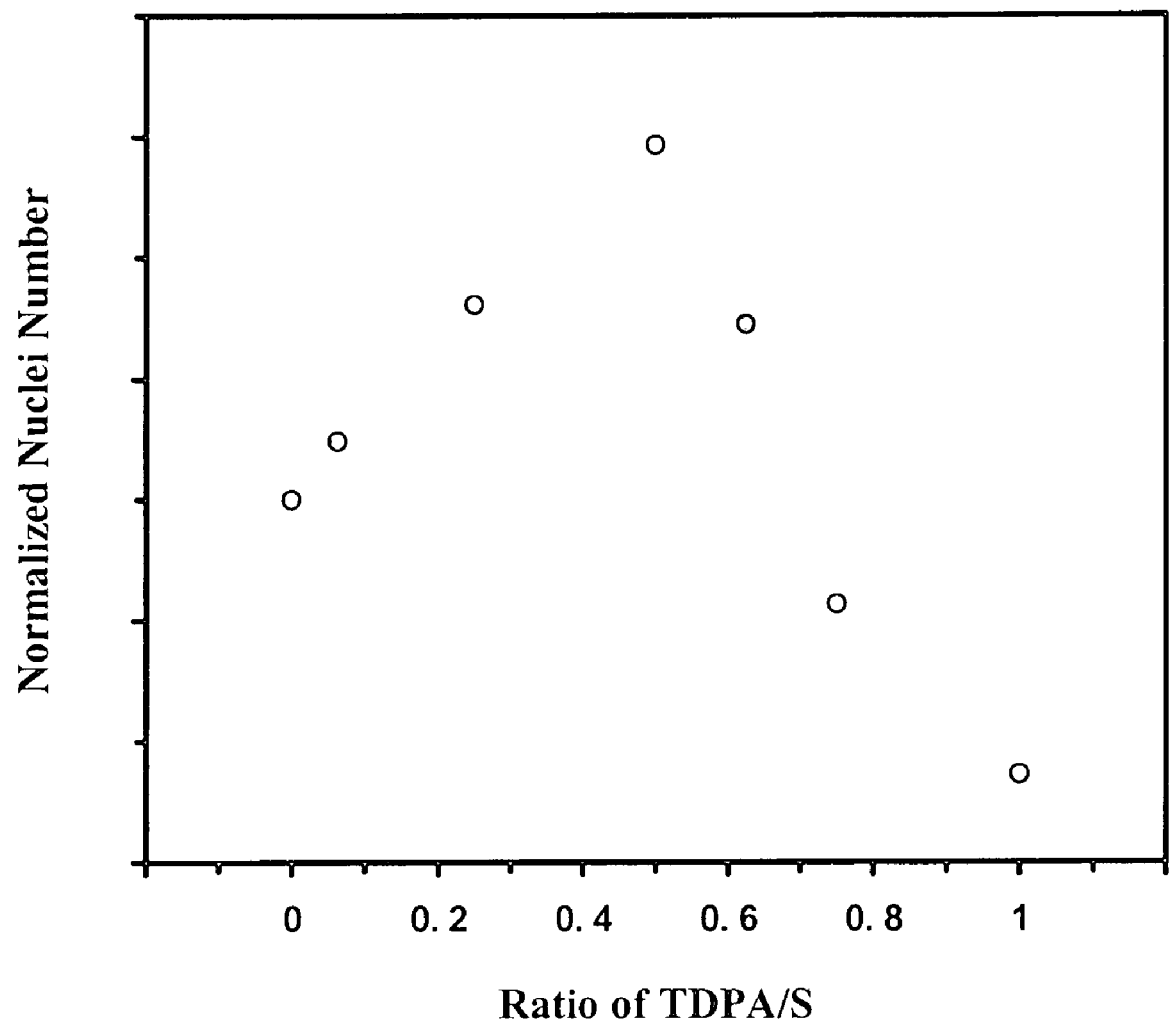
FIG. 22 shows the number of stable nuclei in the synthesis with different TDPA:S ratios.

In a series of seven individual experiments, cadmium myristate (0.1 mmol), sulfur (0.05 mmol) and TDPA (0~0.05 mmol) were added into a three-neck flask with 5 g ODE. The mixture solution was degassed for 10 min under vacuum (~16 mTorr) at room temperature, and then the vacuum was removed. Under an Ar flow, the solution was heated to 240° C. (25° C./min) with gentle stirring, serial aliquots were taken for kinetic studies after the temperature reached 240° C. The ratios of TDPA:S were 0, 1:16, 1:4, 1:2, 5:8, 3:4 and 1:1, respectively. In each synthesis, at least five different-sized particles were chosen to evaluate the number of stable nuclei. Then, the number of stable nuclei was normalized with that found in the synthesis when the ratio of TDPA:S was 0. The relative number of nuclei as a function of the ratio of TDPA:S is shown in FIG. 22.

Figure 23:
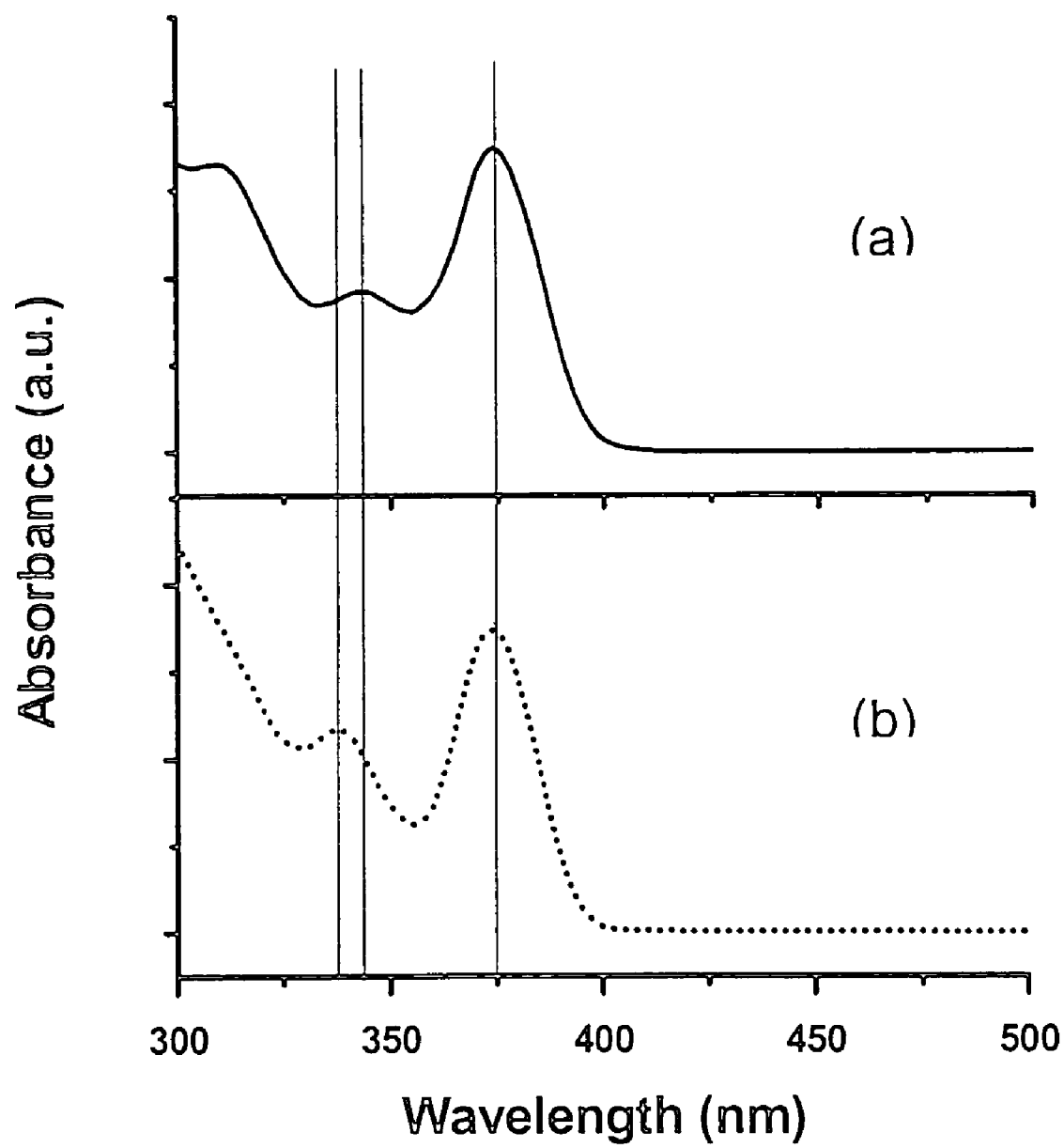
FIGS. 23(a) and (b) are absorption spectra for wurtzite CdS and zinc-blende CdS, respectively.

Surprisingly, the CdS particles made in this series of experiments were found to have a different crystal form (wurtzite) compared with all CdS nanocrystals previously made (zinc-blende). For zinc-blende and wurtzite CdS, nanoparticles with an identical absorption peak position for the first exciton transition band exhibit a nearly identical size. However, the gap between the first and second exciton transition peaks for wurtzite CdS particles is clearly narrower than that for those zinc-blende ones (46 mev for the 2.5-nm nanocrystals, as shown in FIGS. 23(a) and (b). The peak positions for the excition transitions with higher energies also vary for these two types of CdS nanoparticles.

Example 18

Shape Control

This Example demonstrates how to form non-spherical CdSe nanocrystals using non-injection synthesis. In a zinc-blende structure, non-spherical particles normally are cubes, tetrahedral pyramids or triangular prisms, and these non-spherical particles have a higher surface energy than spherical ones. Therefore, making non-spherical particles requires growth conditions with a high chemical potential, which can be achieved by increasing the per-particle concentration of precursors. To create such a condition, a method is chosen to decrease the number of initial nuclei while leaving the precursor concentration unchanged. Because the increasing reactivity of precursors can lead to fewer nuclei, tributylphosphine selenide (TBPSe) was used in place of selenium powder, for making CdSe nanocrystals.

Synthesis of tetrahedral CdSe nanocrystals:Selenium-tributylphosphine (and TBPSe in ODE: 0.05 mmol of TBPSe in a mixture of tributylphosphine and ODE, 0.012 g and 0.5 g, respectively) and cadmium myristate (0.1 mmol) were respectively added into a three-neck flask with octadecene (ODE, 5.0 g). The mixture solution was degassed for 10 min under vacuum (~30 mTorr) at room temperature. Under Ar flow and with stirring, the solution was heated to 240° C. at a rate of 25° C./min. temperature reached 240° C. After 30-min growth, the reaction was terminated by reducing the temperature to room temperature.

Indeed, the number of nuclei at the initial stage in this synthesis decreased by 75%, as compared to the synthesis using selenium powder. After 30 minutes, this synthesis resulted in tetrahedral particles with edge length of 5.0 nm and standard deviation ($\sigma$) of 7%. The high uniformity of these nanocrystals allows the formation of ordered, triangular close-packed nanocrystal assemblies on TEM grids, as shown in the scanned TEM image of FIG. 24.

This invention can be embodied in other forms without departing from the spirit or essential attributes thereof and, accordingly, reference should be had to the following claims rather than the foregoing specification as indicating the scope of the invention.

I claim:

1. A method of forming monodisperse metal chalcogenide nanocrystals without precursor injection, comprising the steps of:
    combining a metal source, a chalcogenide source, and at least one solvent in one pot at a first temperature to form a liquid comprising assembly;
    increasing the temperature of said assembly to a sufficient-temperature to initiate nucleation to form a plurality of metal chalcogenide nanocrystals, and
    growing said plurality of metal chalcogenide nanocrystals without injection of either said metal source or said chalcogenide source by further increasing the temperature of said assembly to a temperature, wherein crystal growth proceeds substantially without nucleation to form a plurality of monodisperse metal chalcogenide nanocrystals.

2. The method of claim 1, wherein said chalcogenide source is a chalcogenide powder, said chalcogenide powder being insoluble in said solvent at said first temperature.

3. The method of claim 2, wherein said chalcogenide powder is selenium powder.

4. The method of claim 3, wherein said metal source comprises cadmium myristate, said metal chalcogenide nanocrystals being CdSe nanocrystals.

5. The method of claim 1, wherein said metal source is cadmium myristate and said chalcogenide source is S powder, said metal chalcogenide nanocrystals being CdS nanocrystals.

6. The method of claim 1, wherein said metal precursor source is zinc myristate and said chalcogenide source is Se powder, said metal chalcogenide nanocrystals being ZnSe nanocrystals.

7. The method of claim 1, said chalcogenide precursor is tributylphosphine telluride (TBPTe) and said metal precursor is cadmium octadecylphosphonate, said metal chalcogenide nanocrystals being CdTe nanocrystals.

8. The method of claim 1, wherein said solvent is octadecene.

9. The method of claim 1, wherein said metal chalcogenide nanocrystals include at least one of two or more different metals and two or different chalcogenides.

10. The method of claim 1, wherein said metal chalcogenide nanocrystals are selected from the group consisting of ZnS, HgS, HgSe, HgTe, $Cd_{1-n}Hg_nSe$, $Cd_{1-n}Hg_nTe$, $Cd_{1-n}Hg_nS$, $Cd_{1-n}Hg_nSe_{1-m}S_m$, $Cd_{1-n}Zn_nS$, $Cd_{1-n}Zn_nSe$, $Cd_{1-n}Zn_nTe$, $Cd_{1-n}Zn_nTe_{1-m}Se_m$ and $Cd_{1-n}Zn_nSe_{1-m}S_m$.

11. The method of claim 1, wherein said metal chalcogenide nanocrystals are doped or alloy nanocrystals selected from the group consisting of $Cd_{1-n}X_n$ C (C=S, Se, Te, X=Mn, Cu, Cr, Co, Fe, Ni, transition metals, and rare earths), or $Zn_{1-n}X_n$ C (C=S, Se, Te, X=Mn, Cu, Cr, Co, Fe, Ni, transition metals, and rare earth).

12. The method of claim 1, wherein said metal chalcogenide nanocrystals have the zinc blende or wurtzite crystal structure.

13. The method of claim 12, wherein said metal chalcogenide nanocrystals comprise CdS having said wurtzite crystal structure or zinc blende crystal structure dependant on a composition of said liquid comprising assembly.

14. The method of claim 12, wherein said metal chalcogenide nanocrystals comprise CdSe having said zinc blende crystal structure.

15. The method of claim 1, further comprising at least one nucleation initiator.

16. The method of claim 15, wherein said initiator comprises a thiazole or a dithiocarbamate and said metal chalcogenide comprises a metal sulfide.

17. The method of claim 15, wherein said initiator comprises benzeneselenol, diphenyldiselenide or BHT, or derivatives thereof, and said metal chalcogenide comprises a metal selenide.

18. The method of claim 15, wherein said initiator comprises benzenetellunol, diphenyldtelluride, or BHT, or derivatives thereof, and said metal chalcogenide comprises a metal telluride.

19. The method of claim 15, wherein said initiator comprises a tetra-ethylthiuram disulfide and a dithiobisbenzothiazole, and said metal chalcogenide comprises CdS.

20. The method of claim 15, wherein said nucleation initiator controls a number of stable nuclei initiated in said heating step.

* * * * *

UNITED STATES PATENT AND TRADEMARK OFFICE
CERTIFICATE OF CORRECTION

PATENT NO. : 7,465,352 B2
APPLICATION NO. : 11/188352
DATED : December 16, 2008
INVENTOR(S) : Y. Charles Cao Page 1 of 1

It is certified that error appears in the above-identified patent and that said Letters Patent is hereby corrected as shown below:

Column 3,
Line 9, "comprises" should read --comprise--.

Lines 12-13, "diphenyldtelluride" should read --diphenyltelluride--.

Column 4,
Lines 28-29, "showing an ordered, triangular close-packed nanocrystal assemblies" should read --showing an ordered, triangular close-packed nanocrystal assembly--.

Line 55, "occur during" should read --occurring during--.

Column 5,
Line 60, "in addition the" should read --in addition to the--.

Column 10,
Line 6, "min. it is" should read --min. It is--.

Column 14,
Line 31, "of aid:S" should read --of acid:S--.

Column 16,
Line 49, "two or different" should read --two or more different--.

Signed and Sealed this

Second Day of June, 2009

JOHN DOLL
*Acting Director of the United States Patent and Trademark Office*